(12) United States Patent
Shimizu et al.

(10) Patent No.: US 10,718,050 B2
(45) Date of Patent: Jul. 21, 2020

(54) CONCENTRATION CONTROL APPARATUS AND MATERIAL GAS SUPPLY SYSTEM

(71) Applicant: HORIBA STEC, CO., LTD., Kyoto (JP)

(72) Inventors: Toru Shimizu, Kyoto (JP); Masakazu Minami, Kyoto (JP)

(73) Assignee: HORIBA STEC, CO., LTD, Kyoto (JP)

(*) Notice: Subject to any disclaimer, the term of this patent is extended or adjusted under 35 U.S.C. 154(b) by 74 days.

(21) Appl. No.: 16/134,082

(22) Filed: Sep. 18, 2018

(65) Prior Publication Data

US 2019/0085444 A1 Mar. 21, 2019

(30) Foreign Application Priority Data

Sep. 19, 2017 (JP) .................................. 2017-179082
Jul. 12, 2018 (JP) .................................. 2018-132341

(51) Int. Cl.
*C23C 16/448* (2006.01)
*C23C 14/54* (2006.01)
*C23C 16/455* (2006.01)

(52) U.S. Cl.
CPC ........ *C23C 14/548* (2013.01); *C23C 16/4481* (2013.01); *C23C 16/45561* (2013.01); *Y10T 137/2509* (2015.04)

(58) Field of Classification Search
CPC .............. C23C 14/548; C23C 16/4481; C23C 16/4482; Y10T 137/2509
See application file for complete search history.

(56) References Cited

U.S. PATENT DOCUMENTS

| | | | |
|---|---|---|---|
| 6,772,072 B2* | 8/2004 | Ganguli | C23C 16/4481 427/248.1 |
| 8,016,945 B2* | 9/2011 | Zilbauer | C23C 16/405 118/715 |
| 8,137,462 B2* | 3/2012 | Fondurulia | C23C 16/4481 118/715 |
| 8,459,291 B2* | 6/2013 | Minami | G05D 11/138 118/689 |
| 8,931,506 B2* | 1/2015 | Nagata | B01B 1/005 118/726 |
| 8,951,478 B2* | 2/2015 | Chu | C23C 16/4482 422/129 |
| 8,997,775 B2* | 4/2015 | Woelk | B01D 7/00 137/110 |

(Continued)

FOREIGN PATENT DOCUMENTS

JP 61-094319 5/1986

*Primary Examiner* — Kevin F Murphy
(74) *Attorney, Agent, or Firm* — Greenblum & Bernstein, P.L.C.

(57) ABSTRACT

Provided is a concentration control apparatus that, without reducing maintainability, can shorten piping to improve responsiveness. The concentration control apparatus is one adapted to introduce carrier gas into a storage tank storing a material, and control the concentration of material gas that is led out of the storage tank as mixed gas with the carrier gas and results from vaporization of the material. Also, the concentration control apparatus includes: a first unit that controls the flow rate of the carrier gas to be introduced into the storage tank; and a second unit that detects the concentration of the material gas led out of the storage tank.

19 Claims, 16 Drawing Sheets

(56) References Cited

U.S. PATENT DOCUMENTS

| | | | |
|---|---|---|---|
| 2004/0007180 A1* | 1/2004 | Yamasaki | C23C 16/16 118/715 |
| 2007/0194470 A1* | 8/2007 | Dedontney | B01F 3/022 261/76 |
| 2008/0141937 A1* | 6/2008 | Clark | C23C 16/16 118/697 |
| 2016/0273101 A1* | 9/2016 | Komori | C23C 16/45561 |

* cited by examiner

CONCENTRATION CONTROL APPARATUS AND MATERIAL GAS SUPPLY SYSTEM

TECHNICAL FIELD

The present invention relates to a concentration control apparatus and a material gas supply system.

BACKGROUND ART

In a semiconductor manufacturing process, when supplying material gas stored in a storage tank to a deposition chamber (chamber), a concentration control apparatus that introduces carrier gas supplied from a carrier gas supply device into the storage tank, and while regulating the concentration of the material gas led out of the storage tank together with the carrier gas, supplies both of the gases to the deposition chamber (chamber) is used.

For example, as disclosed in Patent Literature 1, a conventional concentration control apparatus employs a configuration adapted to, on a panel installed above a storage tank, fix respective pipes such as a pipe extending from a carrier gas supply device to the storage tank and a pipe extending from the storage tank to a deposition chamber, as well as fix respective devices such as mass flow controllers connected to the respective pipes.

However, although the conventional concentration control apparatus has a high degree of design freedom because the respective pipes and the respective devices can be freely arranged on the panel, there are problems that the total length of the respective pipes increases, and along with the increase, the pressure drop of the entire apparatus increases and the size of the apparatus itself increases. Further, when the pipe extending from the storage tank to the deposition chamber elongates, there is also a problem of deterioration in responsiveness. Therefore, the integration of the entire apparatus exists as one of requirements.

Also, in the concentration control apparatus, a pipe connected to the lower stream side than the storage tank, through which material gas flows, is contaminated due to attachment of the material gas, and therefore it is necessary to perform regular maintenance such as replacement of pipes, so an improvement in maintainability also exists as one of the requirements.

Further, in the conventional concentration control apparatus, since the respective pipes are separated, it is necessary to install a heater for each of the pipes. However, when attempting to integrate the entire apparatus in order to respond to the requirements, the respective pipes are closely packed, and along with this, there is a problem of being unable to install a heater for a pipe requiring heating.

CITATION LIST

Patent Literatures

Patent Literature 1: Japanese Unexamined Patent Application Publication No. 61-094319

SUMMARY OF INVENTION

Technical Problem

Therefore, the main object of the present invention is to provide a concentration control apparatus that, without reducing maintainability, can shorten piping to improve responsiveness. Also, another object of the present invention is to provide a concentration control apparatus that, while integrating respective pipes, can surely heat a pipe (flow path) requiring heating.

Solution to Problem

That is, the concentration control apparatus according to the present invention is one adapted to introduce carrier gas into a storage tank storing a material, and control the concentration of material gas that is led out of the storage tank as mixed gas with the carrier gas and results from vaporization of the material. In addition, the concentration control apparatus includes: a first unit that controls the flow rate of the carrier gas to be introduced into the storage tank; and a second unit that detects the concentration of the material gas led out of the storage tank. Further, the first unit includes: a first block having inside a carrier gas flow path through which the carrier gas flows; a first flow rate sensor that detects the flow rate of the carrier gas flowing through the carrier gas flow path; and a first flow rate control valve that on the basis of the detected value of the first flow rate sensor, controls the flow rate of the carrier gas flowing through the carrier gas flow path, and the second unit includes: a second block that has inside a mixed gas flow path through which the mixed gas flows and is attachably/detachably connected to the first block; and a concentration detector that detects the concentration of the material gas flowing through the mixed gas flow path.

Such a concentration control apparatus can efficiently integrate respective pipes extending from the storage tank, and in doing so, a pressure drop can be reduced because the total length of the respective pipes extending from the storage tank is shortened. Also, a configuration adapted to form the carrier gas flow path serving as a part of a pipe extending from a carrier gas supply device to the storage tank and the mixed gas flow path serving as a part of a pipe extending from the storage tank to a deposition chamber in the separate blocks and to install respective devices necessary for each of the flow paths in a corresponding block is employed, and therefore replacement or the like of only the second block having the mixed gas flow path likely to be contaminated can be performed, thus greatly improving maintainability. Further, as long as the first block is configured to be capable of being selectively connected with multiple second blocks respectively installed with concentration detectors whose light passing parts in the mixed gas flow path are different, the second block installed with a concentration detector most suitable for the absorbance of material gas to be supplied to a supply destination can be selectively connected to the first block, thus facilitating design change. In addition, as the first block, a common one can be used, and therefore manufacturing cost can be suppressed.

Also, the concentration control apparatus may be one configured to, when connecting the first block and the second block, be able to form a first bypass flow path that branches from the upper stream side than the first flow rate control valve in the carrier gas flow path and merges with the upper stream side than the concentration detector in the mixed gas flow path.

For the concentration control apparatus, a pressure method adapted to control the pressure in the mixed gas flow path and a dilution method adapted to control the flow rate of the carrier gas to be introduced into the mixed flow path from the carrier gas flow path via the bypass flow path are available as a method for controlling the concentration of the material gas to be supplied to a supply destination. By employing the above configuration, any of the above methods can be used depending on whether the first bypass flow path is formed. In doing so, parts can be standardized for both methods, and therefore manufacturing cost can be reduced.

Also, when using the concentration control apparatus by the dilution method, i.e., when connecting the first block and the second block to form the first bypass flow path, it is only necessary that the first bypass flow path branches from the upper stream side than the first flow rate sensor in the carrier gas flow path, the first unit or the second unit further includes: a second flow rate sensor that detects the flow rate of the carrier gas flowing through the first bypass flow path; and a second flow rate control valve that controls the flow rate of the carrier gas flowing through the first bypass flow path, and the concentration control apparatus is configured to, on a basis of detected values of the concentration detector and the second flow rate sensor, and the detected value of the first flow rate sensor, control the concentration of the material gas flowing through the mixed gas flow path by the first flow rate control valve and the second flow rate control valve. Alternatively, it is only necessary that the first bypass flow path branches from the lower stream side than the first flow rate sensor in the carrier gas flow path, the first unit or the second unit further includes a second flow rate control valve that controls the flow rate of the carrier gas flowing through the first bypass flow path, and the concentration control apparatus is configured to, on the basis of the detected values of the concentration detector and the first flow rate sensor, control the concentration of the material gas flowing through the mixed gas flow path by the first flow rate control valve and the second flow rate control valve. In this case, as compared with the former, the latter can omit one flow rate sensor, and in doing so, manufacturing cost can be suppressed.

Further, when using the concentration control apparatus by the pressure method, i.e., when not forming the first bypass flow path, it is only necessary that the second unit further includes a third flow rate control valve that controls the flow rate of the mixed gas flowing through the mixed gas flow path, and the concentration control apparatus is configured to, on the basis of the detected value of the concentration detector, control the concentration of the material gas flowing through the mixed gas flow path by the third flow rate control valve.

In addition, any of the above-described concentration control apparatuses may be one in which, when connecting the first block and the second block to form the second bypass flow path, the first unit further includes a first opening/closing valve on the lower stream side than a branch point of the second bypass flow path in the carrier gas flow path, the second unit further includes a second opening/closing valve on the upper stream side than a branch point of the second bypass flow path in the mixed gas flow path, and the first unit or the second unit further includes a third opening/closing valve in the second bypass flow path.

In such a configuration, only by operating the first opening/closing valve, second opening/closing valve, and third opening/closing valve, without interrupting the supply of the carrier gas, the material gas can be stopped from being led out of the concentration control apparatus. Also, work to purge the concentration control apparatus can be performed using the second bypass flow path.

Further, in any of the above-described concentration control apparatuses, the concentration detector may be configured to include: a light source that irradiates the mixed gas flowing through the mixed gas flow path with light; and a light receiver that detects light that transmitted through the mixed gas after emission from the light source.

Still further, the concentration detector may be one further including a reflective mirror that, in a direction away from the second block, bends the light that transmitted through the mixed gas after the emission from the light source.

The mixed gas flow path is heated by a heater to prevent the material gas from reliquefying. For this reason, the effect of heat generated from the heater increases toward the second block provided with the mixed gas flow path. However, by employing the configuration as described above, the light receiver susceptible to heat can be arranged away from the second block.

Also, the second unit may be one further including a pressure sensor that detects the pressure in the mixed gas flow path.

In addition, at least one of the first block and the second block may be one provided inside with a heater. In this case, the first block and the second block may be configured to be connected in a surface contact state.

In such a configuration, by employing structure adapted to connect the first block and the second block in the surface contact state, heat from a heater installed in each of the blocks transfers to the other block, and this makes it possible to surely heat a flow path that is formed inside each block and cannot be easily installed with a heater.

Also, in the concentration control apparatus including the first opening/closing valve, second opening/closing valve, and third opening/closing valve, the first unit or the second unit may be one further including a fourth opening/closing valve on the lower downstream side than the second flow rate control valve in the first bypass flow path. The concentration control apparatus having such a configuration may be one further having the following configuration.

That is, the concentration control apparatus may be configured to, when the detected value of the pressure sensor is larger than a predetermined setting pressure value, bring the second opening/closing valve, third opening/closing valve, and fourth opening/closing valve into a closed state.

In such a configuration, a pressure rise on the secondary side of the concentration control apparatus can be prevented, and this makes it possible to prevent the concentration detector having low pressure resistance from being broken.

Also, it may be possible that the first unit further includes a first pressure sensor that detects pressure on the lower stream side than the first flow rate control valve and on the upper stream side than the first opening/closing valve in the carrier gas flow path, the first unit or the second unit further includes a second pressure sensor that detects pressure on the lower stream side than the second flow rate control valve and on the upper stream side than the fourth opening/closing valve in the first bypass flow path, and the concentration control apparatus is configured to, when the detected value of the first pressure sensor is larger than a predetermined setting internal pressure value, bring the first flow rate control valve, first opening/closing valve, second opening/closing valve, and fourth opening/closing valve into a closed state, as well as bring the third opening/closing valve into an opened state, and when the detected value of the second pressure sensor is larger than the setting internal pressure value, bring the second flow rate control valve, first opening/closing valve, second opening/closing valve, and third opening/closing valve into a closed state, as well as bring the fourth opening/closing valve into an opened state.

In such a configuration, a rise in the internal pressure of the concentration control apparatus can be prevented, and this makes it possible to prevent the concentration detector having low pressure resistance from being broken.

Alternatively, it may be possible that the first unit further includes a first pressure sensor that detects pressure on the lower stream side than the first flow rate control valve and on the upper stream side than the first opening/closing valve in the carrier gas flow path and a third pressure sensor that detects pressure on the lower stream side than the first opening/closing valve, the first unit or the second unit further includes a second pressure sensor that detects pressure on the lower stream side than the second flow rate control valve and on the upper stream side than the fourth opening/closing valve in the first bypass flow path, and the concentration control apparatus is configured to, when the detected value of the first pressure sensor is smaller than the detected value of the third pressure sensor, keep the first opening/closing valve in a closed state, when the detected value of the first pressure sensor is smaller than the detected value of the pressure sensor, keep the third opening/closing valve in a closed state, and when the detected value of the second pressure sensor is smaller than the detected value of the pressure sensor, keep the fourth opening/closing valve in a closed state.

In such a configuration, the backflow of the material in the storage tank and the material gas resulting from vaporization of the material into the concentration control apparatus, and the backflow of the mixed gas flowing through the mixed gas flow path to the carrier gas flow path and the first bypass flow path can be prevented. This makes it possible to prevent a flow rate controller from being broken.

Also, it may be possible that the first unit further includes a fifth opening/closing valve on the upper stream side than a branch point to the first bypass flow path in the carrier gas flow path, and the concentration control apparatus is configured to, when receiving a replacement signal for the storage tank, open/close the fifth opening/closing valve at predetermined time intervals. Further, it may be possible that the first unit further includes a fifth opening/closing valve on the upper stream side than a branch point to the first bypass flow path in the carrier gas flow path, and the concentration control apparatus is configured to, when receiving a zero point adjustment signal for the first flow rate sensor, adjust the zero point of the first flow rate sensor with the first opening/closing valve, third opening/closing valve, and fifth opening/closing valve in a closed state, and when receiving a zero point adjustment signal for the second flow rate sensor, adjust the zero point of the second flow rate sensor with the fourth opening/closing valve and the fifth opening/closing valve in a closed state. Still further, it may be possible that the second unit further includes a sixth opening/closing valve installed on the downstream side of the concentration detector in the mixed gas flow path, and the concentration control apparatus is configured to, when receiving a calibration signal for a flow rate controller that on the basis of the detected value detected by the first flow rate sensor, controls the first flow rate control valve, bring the first flow rate control valve into an opened state from a state where a synthetic flow path consisting of a flow path from the first flow rate control valve to the first opening/closing valve in the carrier gas flow path; a flow path on the downstream side of the second flow rate control valve in the first bypass flow path; the second bypass flow path; and a flow path from the second opening/closing valve to the sixth opening/closing valve in the mixed gas flow path is depressurized inside, and calibrate the first flow rate sensor on the basis of the volume of the synthetic flow path and the detected values of the first flow rate sensor and the pressure sensor, and when receiving a calibration signal for a flow rate controller that on the basis of a detected value detected by the second flow rate sensor, controls the second flow rate control valve, bring the second flow rate control valve into an opened state from the state where the synthetic flow path is depressurized inside, and calibrate the second flow rate sensor on the basis of the volume of the synthetic flow path and the detected values of the second flow rate sensor and the pressure sensor.

In such configurations, the concentration control apparatus can perform a cycle purge and the zero point adjustment and calibration of the flow rate controller by itself.

Further, the concentration control apparatus may be one including an alert function that issues an alert when a lead-out amount of the material led out of the storage tank, which is calculated on the basis of a detected value detected by the concentration detector, and the detected values detected by the first flow rate sensor and the second flow rate sensor, reaches a predetermined prescribed amount.

In such a configuration, it is possible to know the appropriate replacement time of the storage tank, and the storage tank can be prevented from coming into an empty state.

Also, a material gas supply system according to the present invention is one including: any of the above-described concentration control apparatuses; and the storage tank connected to the concentration control apparatus.

Advantageous Effects of Invention

According to the present invention configured as described above, a concentration control apparatus that, without reducing maintainability, can shorten piping to improve responsiveness can be provided. Also, according to the present invention, a concentration control apparatus that, while integrating respective pipes, can surely heat a pipe (flow path) requiring heating can be provided.

DESCRIPTION OF EMBODIMENTS

In the following, a material gas supply system using the concentration control apparatus according to the present invention will be described on the basis of the drawings.

The material gas supply system using the concentration control apparatus according to the present invention is one used mainly in a semiconductor manufacturing process, and specifically, used to supply material gas produced by vaporization of a material (specifically, material gas produced by evaporation of a liquid material or material gas produced by sublimation of a solid material) stored in a storage tank to a supply destination such as a deposition chamber (chamber) while controlling the concentration of the material gas. Note that the material gas supply system according to the present invention can also be used in other than the semiconductor manufacturing process, and further only the concentration control apparatus according to the present invention can also be used in other than the semiconductor manufacturing process.

First Embodiment

Figure 1:
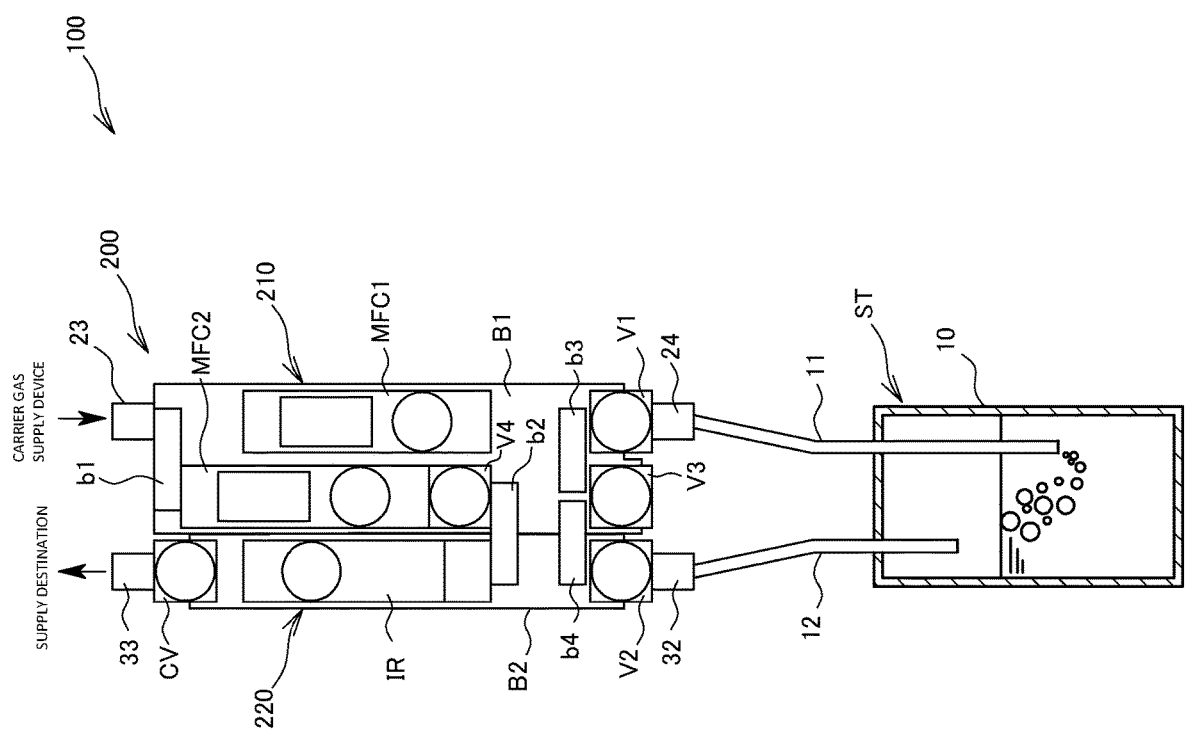
FIG. 1 is a schematic diagram illustrating a material gas supply system according to a first embodiment.

As illustrated in FIG. 1, a material gas supply system 100 using a concentration control apparatus according to the present invention includes: a storage tank ST for storing a material; and the concentration control apparatus 200 connected to the storage tank ST. In addition, in the present embodiment, the concentration control apparatus 200 is arranged above the storage tank ST, and installed on an installation site such as an unillustrated panel or wall via a heat insulating block 300 (see FIG. 2).

The storage tank ST includes: a tank main body 10 for storing the material; an introduction pipe 11 for introducing carrier gas into the tank main body 10; and a lead-out pipe 12 for leading out mixed gas consisting of the carrier gas and the material gas from the tank main body 10.

Figure 2:
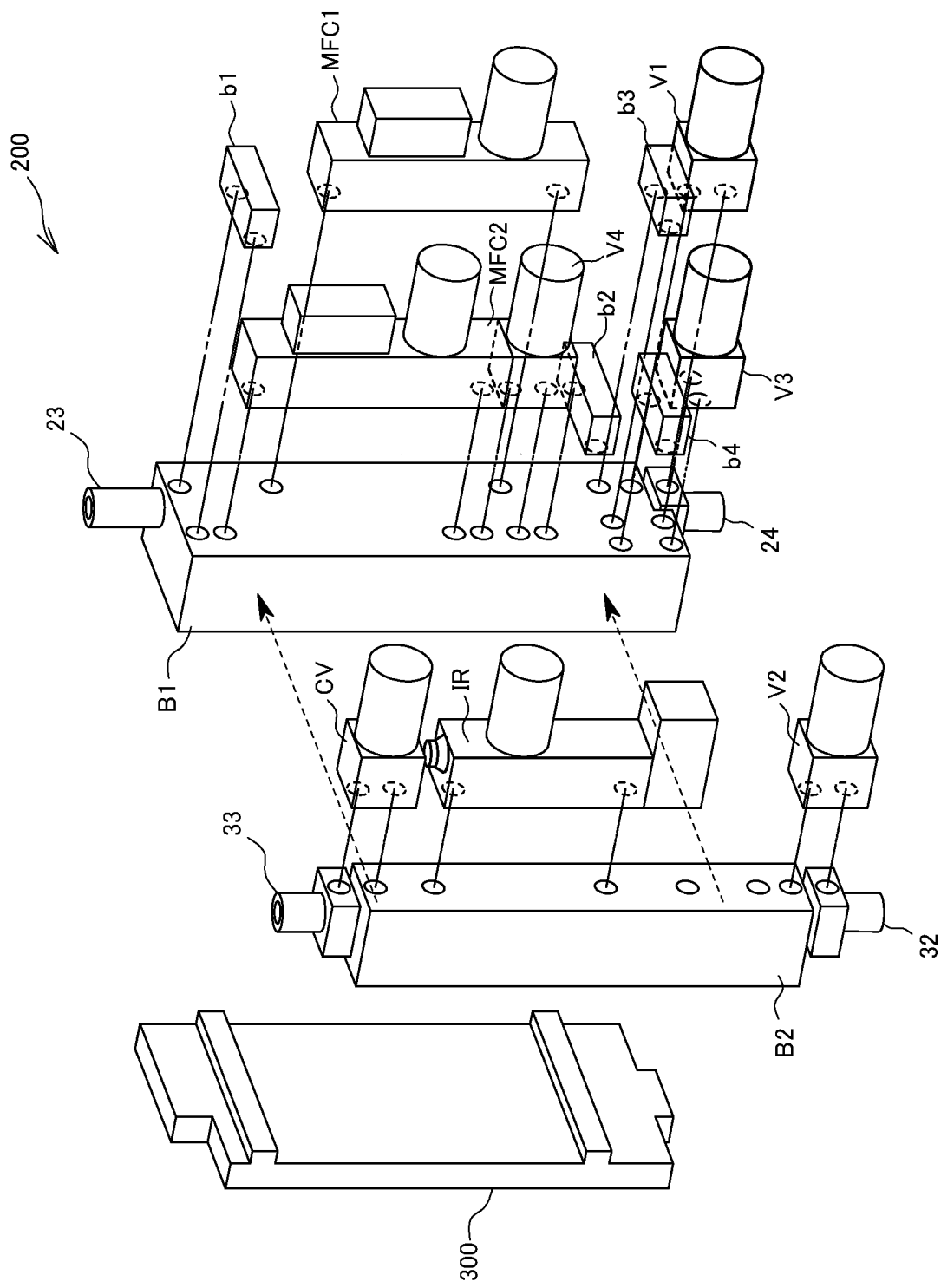
FIG. 2 is an exploded perspective view schematically illustrating a concentration control apparatus according to the first embodiment.

As illustrated in FIGS. 1 and 2, the concentration control apparatus 200 includes: a first unit 210 connected to the introduction pipe 11 and having a function of controlling the flow rate of the carrier gas to be supplied to the storage tank ST from a carrier gas supply device (not illustrated) through the introduction pipe 11; and a second unit 220 connected to the lead-out pipe 12 and adapted to detect the concentration of the material gas contained in the mixed gas to be supplied from the storage tank ST to the supply destination through the lead-out pipe 12. Note that the first unit 210 and the second unit 220 are structured to be mutually attachably/detachably connectable. That is, the concentration control apparatus 200 is configured as a combination of block elements, i.e., the first unit 210 and the second unit 220.

The first unit 210 includes: a first block BE and two flow rate controllers MFC, three opening/closing valves V, and four bypass blocks b installed on predetermined faces of the first block B1. In addition, the first unit 210 is a structure in which by communicating multiple internal flow paths R formed in the first block B1 via internal flow paths r of the respective members MFC, V, and b installed on the predetermined faces of the first block B1, a carrier gas flow path L1, the upstream side of a first bypass flow path L2, and the upstream side of a second bypass flow path L3 are formed. In the following, this structure will be described in detail mainly based on FIGS. 3, 4, 6, and 7. In addition, in FIG. 3(a), the respective internal flow paths R are indicated by dashed lines, and in FIG. 3(b), the carrier gas flow path L1, the first bypass flow path L2, and the second bypass flow path L3 are indicated by dashed lines. Also, in FIG. 4, the carrier gas flow path L1 is indicated by a thick solid line, and the first bypass flow path L2 and the second bypass flow path L3 are indicated by thick dashed lines.

Figure 3:
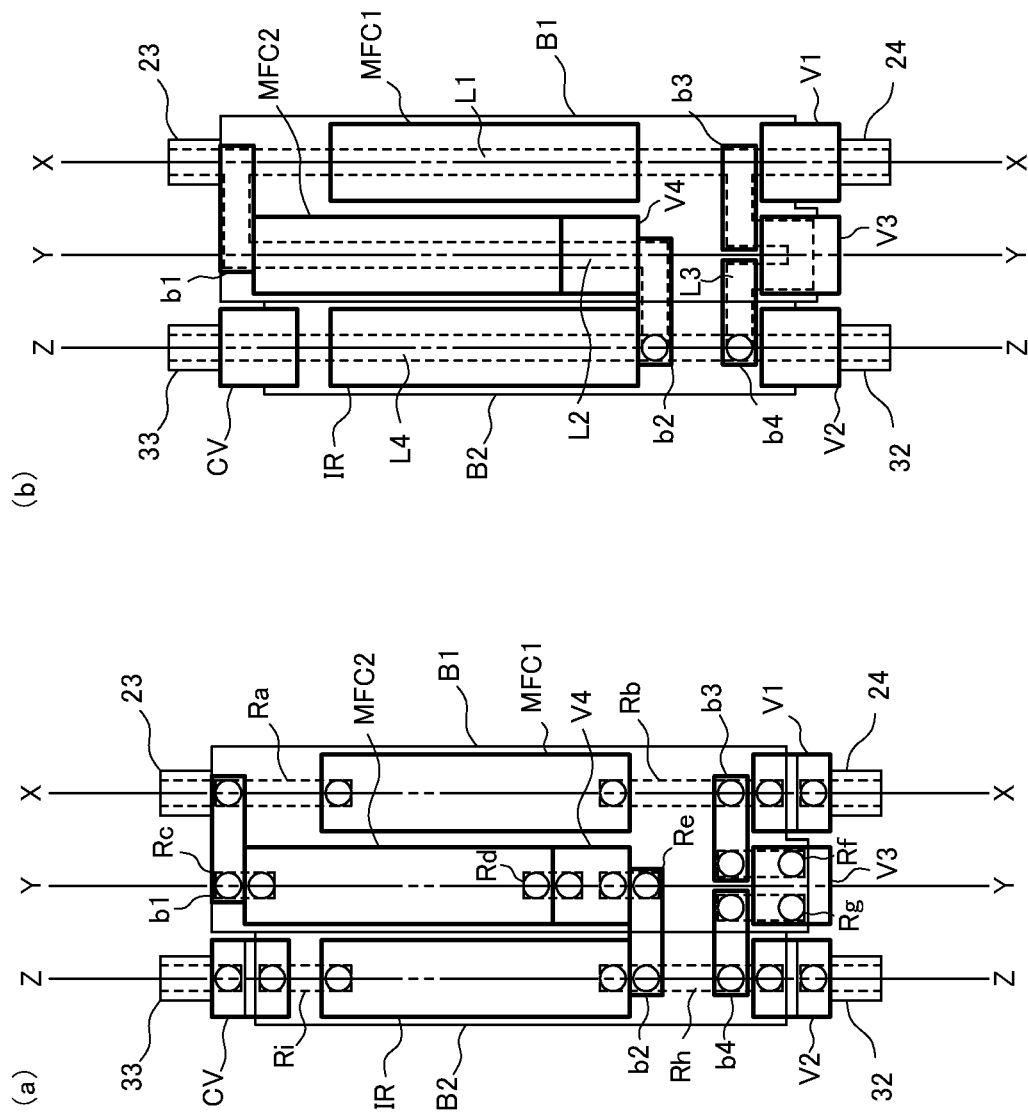
FIG. 3 is a schematic diagram illustrating the concentration control apparatus according to the first embodiment.
Figure 4:
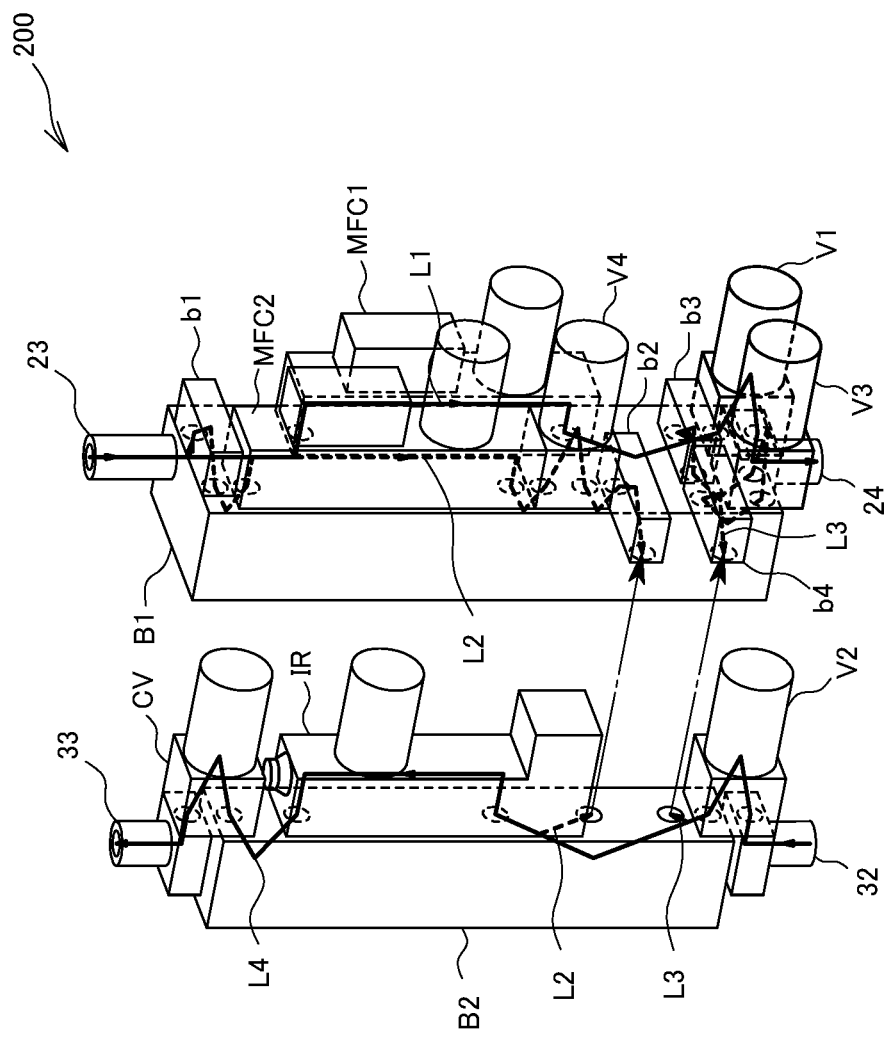
FIG. 4 is a perspective view illustrating the concentration control apparatus according to the first embodiment.

The first block B1 is one of a rectangular parallelepiped shape, and as illustrated in FIGS. 3 and 4, at one end side in its longer direction, an introduction port 23 for introducing the carrier gas is provided, and at the other end side in the longer direction, a lead-out port 24 for leading out the carrier gas is provided. Note that in the present embodiment, the lead-out port 24 is formed by a block different from the first block B1, but may be integrally formed as with the introduction port 23. Also, the first block B1 may be structured to be divided into multiple elements to the extent of not impairing functions.

Figure 6:
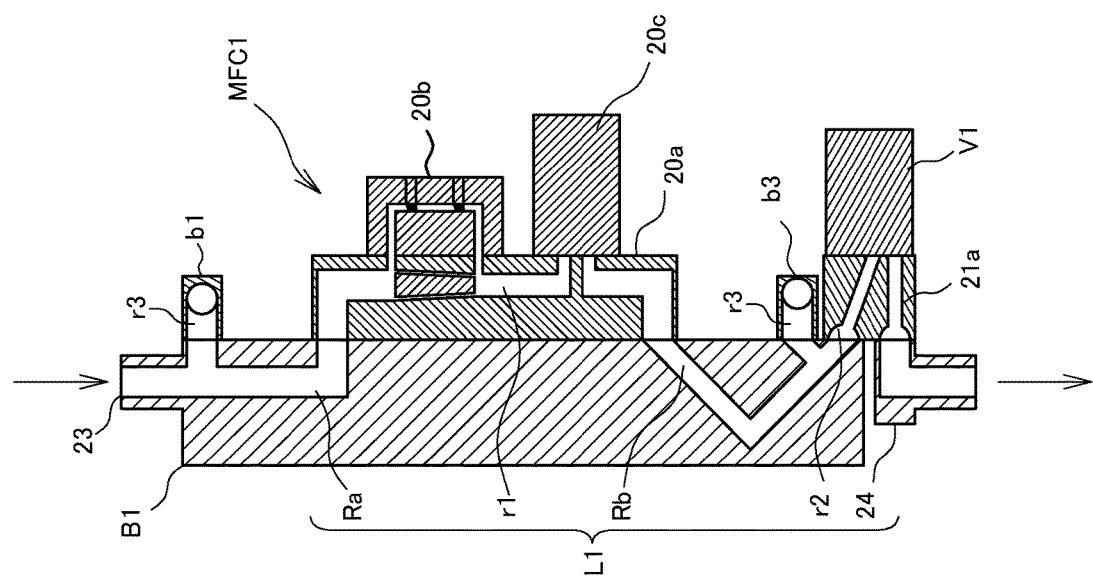
FIG. 6 is an X-X cross-sectional view illustrating the concentration control apparatus according to the first embodiment.

As illustrated in FIG. 3(a), in the first block B1, an internal flow path Ra and an internal flow path Rb are formed sequentially from the upstream side in a first straight line X connecting the introduction port 23 and the lead-out port 24. In addition, the internal flow path Ra is communicated with the introduction port 23. Further, as illustrated in FIG. 6, in the first block B1, the internal flow path Ra and the internal flow path Rb are connected via an internal flow path r1 of a first flow rate controller MFC1, and the internal flow path Rb and the lead-out port 24 are connected via an internal flow path r2 of a first opening/closing valve V1. In doing so, the carrier gas flow path L1 illustrated in FIG. 3(b) is formed.

Figure 7:
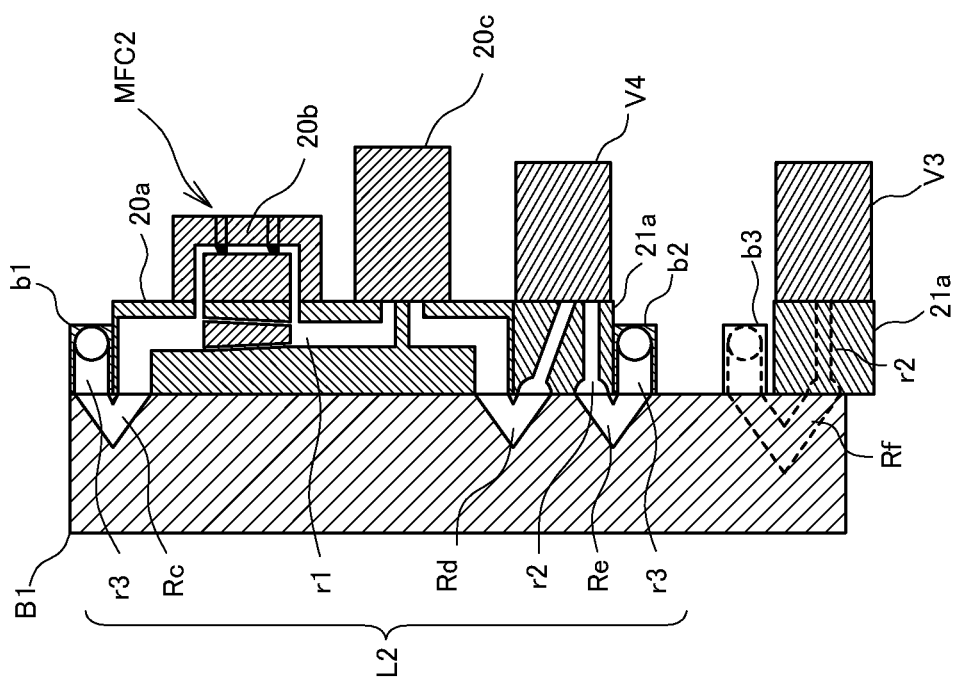
FIG. 7 is a Y-Y cross-sectional view illustrating the concentration control apparatus according to the first embodiment.

Also, in the first block B1, as illustrated in FIG. 3(a), an internal flow path Rc, internal flow path Rd, and internal flow path Re are formed sequentially from the upstream side in a second straight line Y arranged parallel to the first straight line X. Further, as illustrated in FIG. 7, in the first block B1, the internal flow path Ra and the internal flow path Rc are connected via an internal flow path r3 of a first bypass block b1, the internal flow path Rc and the internal flow path Rd are connected via an internal flow path r1 of a second flow rate controller MFC2, the internal flow path Rd and the internal flow path Re are connected via an internal flow path r2 of a fourth opening/closing valve V4, and the internal flow path Re is connected with an internal flow path r3 of a second bypass block b2. In doing so, the upstream side of the first bypass flow path L2 illustrated in FIG. 3(b) is formed.

Further, in the first block B1, as illustrated in FIG. 3(a), along the downstream side of the second straight line Y, an internal flow path Rf and an internal flow path Rg are formed arranged parallel. In addition, in the first block B1, as illustrated in FIG. 3(a), the internal flow path Rb and the internal flow path Rf are connected via the internal flow path r3 of the third bypass block b3, the internal flow path Rf and the internal flow path Rg are connected via an internal flow path r2 of a third opening/closing valve V3, and the internal flow path Rg is connected with an internal flow path r3 of a fourth bypass block b4. In doing so, the upstream side of the second bypass flow path L3 illustrated in FIG. 3(b) is formed.

Figure 5:
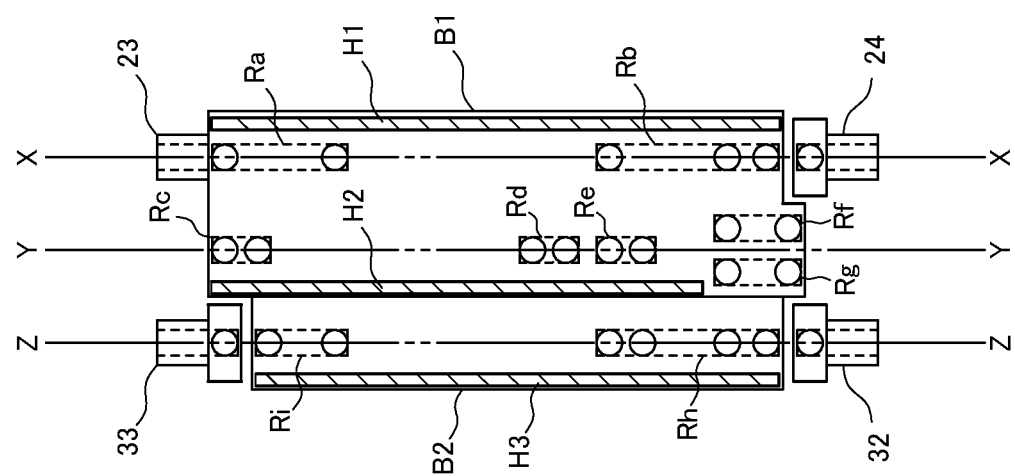
FIG. 5 is a schematic diagram illustrating heaters of first and second blocks according to the first embodiment.

Still further, in the first block B1, as illustrated in FIG. 5, a first heater H1 is incorporated on the outer surface side along the internal flow paths Ra and Rb provided in the first straight line X, and also a second heater H2 is incorporated on the outer surface side along the internal flow paths Rc to Re provided in the second straight line Y. Note that these heaters H1 and H2 play a role in preliminarily heating the carrier gas passing through the first block B1.

The flow rate controllers MFC are so-called thermal type mass flow controllers both having the same configuration. Specifically, as illustrated in FIG. 6 or 7, each of the flow rate controllers MFC includes a seat block 20a installed on a predetermined face of the first block B1. The seat block 20a is one of a rectangular parallelepiped shape, in which the internal flow path r1 communicatively connected to the internal flow path Ra of the first block B1 is formed. In addition, the flow rate controller MFC is one for monitoring the flow rate of the fluid flowing through the internal flow path r1 of the seat block 20a to control the flow rate. For this reason, on the seat block 20a, a flow rate sensor 20b for detecting the flow rate and a flow rate control valve 20c for controlling the flow rate on the basis of the detected value of the flow rate sensor 20b are installed. Note that in the present embodiment, the thermal type mass flow controllers are used, but without limitation to this, mass flow controllers of another type such as a pressure type can also be used.

The opening/closing valves V are ones all having the same configuration, and specifically, as illustrated in FIG. 6, the opening/closing valve V includes a seat block 21a installed on a predetermined face of the first block B1. The seat block 21a is one of a rectangular parallelepiped shape, in which the internal flow path r2 communicatively connected to the internal flow path R of the first block B1 is formed. In addition, the opening/closing valve V is one that regulates the flow rate of the fluid flowing through the internal flow path r2 of the seat block 21a by being opened/closed.

Each of the bypass blocks b is one of a rectangular parallelepiped shape, in which the internal flow path r3 communicatively connected to the internal flow path R of the first block B1 is formed.

By configuring in this manner, as illustrated in FIGS. 3(b) and 4, in the first unit 210, the first block B1 is formed with: the carrier gas flow path L1 extending from the introduction port 23 to the lead-out port 24; the upstream side of the first bypass flow path L2 branching and extending from the upper stream side than the first flow rate controller MFC 1 in the carrier gas flow path L1; and the upstream side of the second bypass flow path L3 branching and extending from the downstream side of the first flow rate controller MFC 1 in the carrier gas flow path L1.

As illustrated in FIGS. 1 and 2, the second unit 220 includes: the second block B2; and a second opening/closing valve V2, a concentration detector IR, and a flow rate control valve CV installed on predetermined faces of the second block B2. In addition, the second unit 220 is a structure in which by communicating multiple internal flow paths R formed in the second block B2 via internal flow paths r of the respective members V, IR, and CV installed on the predetermined faces of the second block B2, a mixed gas flow path L4, the downstream side of the first bypass flow path L2, and the downstream side of the second bypass flow path L3 are formed. In the following, this structure will be described in detail mainly based on FIGS. 3, 4, and 8. In addition, in FIG. 3(a), the respective internal flow paths R are indicated by dashed lines, and in FIG. 3(b), the mixed gas flow path L4, the first bypass flow path L2, and the second bypass flow path L3 are indicated by dashed lines. Also, in FIG. 4, the mixed gas flow path L4 is indicated by a thick solid line, and the downstream side of the first bypass flow path L2 and the downstream side of the second bypass flow path L3 are indicated by thick dashed lines.

The second block B2 is one of a rectangular parallelepiped shape, and as illustrated in FIGS. 3 and 4, at one end side in its longer direction, a lead-out port 33 for leading out the mixed gas is provided, and at the other end side in the longer direction, an introduction port 32 for introducing the mixed gas is provided. Note that in the present embodiment, the introduction port 32 and the lead-out port 33 are formed by a block different from the second block B2, but may be formed integrally with the second block B2. Also, the second block B2 may be structured to be divided into multiple elements to the extent of not impairing functions.

Figure 8:
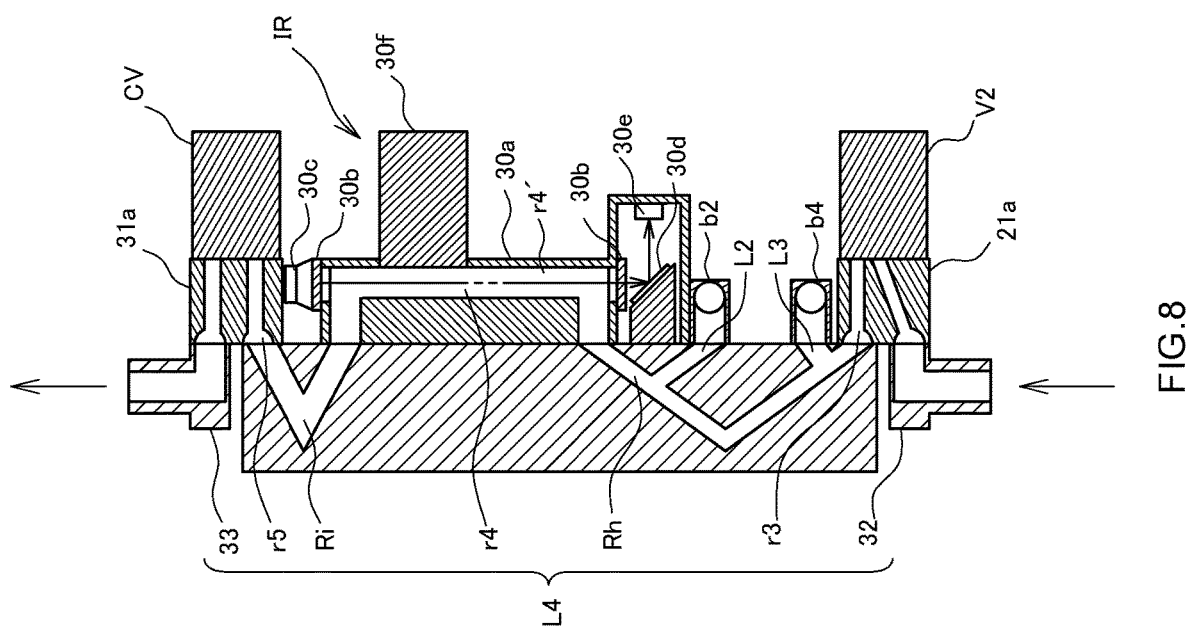
FIG. 8 is a Z-Z cross-sectional view illustrating the concentration control apparatus according to the first embodiment.

As illustrated in FIG. 3(a), in the second block B2, an internal flow path Rh and an internal flow path Ri are formed sequentially from the upstream side in a third straight line Z connecting the introduction port 32 and the lead-out port 33. In addition, in the second block B2, as illustrated in FIG. 8, the introduction port 32 and the internal flow path Rh are connected via an internal flow path r3 of the second opening/closing valve V2, the internal flow path Rh and the internal flow path Ri are connected via an internal flow path r4 of the concentration detector IR, and the internal flow path Ri and the lead-out port 33 are connected via an internal flow path r5 of the flow rate control valve CV. In doing so, the mixed gas flow path L4 illustrated in FIG. 3(b) is formed. Also, in the second block B2, as illustrated in FIG. 8, the downstream side of the first bypass flow path L2 and the downstream side of the second bypass flow path L3, which respectively merge with the internal flow path Rh through openings in predetermined faces, are formed.

Further, in the second block B2, as illustrated in FIG. 5, a third heater H3 is incorporated along the internal flow paths Rh and Ri provided in the third straight line Z. Note that the third heater H3 plays a role in heating for preventing the material gas in the mixed gas passing through the second block B2 from being accumulated or attached in the mixed gas flow path L4.

The concentration detector IR is a so-called absorption spectrometer. Specifically, as illustrated in FIG. 8, the concentration detector IR includes an inspecting block 30a installed on a predetermined face of the second block B2. The inspecting block 30a is one of a rectangular parallelepiped shape, in which the internal flow path r4 communicatively connected to the internal flow path R of the second block B2 is formed. Note that the concentration detector IR is one adapted to irradiate the mixed gas flowing through the internal flow path r4 of the inspecting block 30a with light, and on the basis of the intensity of light having transmitted through the mixed gas, detect the concentration of the material gas contained in the mixed gas. Accordingly, in the inspecting block 30a, an inspecting flow path r4' as a part of the internal flow path r4 is formed penetrating in its longer direction, and paired light transmitting windows 30b are installed at both ends of the inspecting flow path r4'. Also, in the inspecting block 30a, a light source 30c is installed on one light transmitting window 30b side, and on the other light transmitting window 30b side, a reflective mirror 30d adapted to reflect light emitted from the light source 30c in a direction away from the second block B2, a light receiver 30e adapted to receive light reflected by the reflective mirror 30d, and a pressure sensor 30f connected to the internal flow path r4 are installed. Further, in the inspecting block 30a, a heater (not illustrated) is incorporated along the internal flow path r4. In addition, the heater plays a role in heating for preventing the material gas in the mixed gas passing through the inspecting block 30a from being accumulated or attached in the mixed gas flow path L4. Incidentally, the sensitivity of the concentration detector 30 is determined by a distance by which the light transmits through the mixed gas, and therefore as the length of the inspecting flow path r4' in the inspecting block 30a is increased, the sensitivity increases.

As illustrated in FIG. 8, the flow rate control valve CV includes a seat block 31a installed on a predetermined face of the second block B2. The seat block 31a is one of a rectangular parallelepiped shape, in which the internal flow path r5 communicatively connected to the internal flow path R of the second block B2 is formed. Note that the flow rate control valve CV is one adapted to regulate the flow rate of the fluid flowing through the internal flow path r5 of the seat block 31a.

By configuring in this manner, as illustrated in FIGS. 3(a) and 4, in the second unit 220, the second block B2 is formed with the mixed gas flow path L4 extending from the introduction port 32 to the lead-out port 33, and the downstream side of the first bypass flow path L2 and the downstream side of the second bypass flow path L3 are formed in such a manner as to merge with the upper stream side than the concentration detector IR in the mixed gas flow path L4.

Next, the assembly of the first unit 210 and the second unit 220 will be described.

The first unit 210 and the second unit 220 are structures that can be integrated by connecting the first block B1 and the second block B2 by connecting means. In addition, as illustrated in FIG. 4, when connecting the first block B1 and the second block B2, the upstream side of the second bypass flow path L3 and the downstream side of the second bypass flow path L3 are connected, and thereby as illustrated in FIG. 3(b), the second bypass flow path L3 is formed. The connecting means may be, for example, means adapted to perform fastening by screws passing through the second block B2 and reaching the first block B1, but is not limited to this.

Also, as illustrated in FIG. 4, before connecting the first block B1 and the second block B2, it is possible to select whether to connect the upstream side of the first bypass flow path L2 and the downstream side of the first bypass flow path L2. Further, when connecting the upstream side of the first bypass flow path L2 and the downstream side of the first bypass flow path, as illustrated in FIG. 3(b), the first bypass flow path L2 is formed. In doing so, the concentration control apparatus 200 can be used by a dilution method that, by the flow rate of the carrier gas to be introduced from the carrier gas flow path L1 to the mixed gas flow path L4 via the first bypass flow path L2, controls the concentration of the material gas to be supplied to the supply destination. Note that when using the concentration control apparatus 200 by the dilution method, the need for the flow rate control valve CV is eliminated, and by replacing it with a bypass block, cost can be reduced.

On the other hand, when not connecting the upstream side of the first bypass flow path L2 and the downstream side of the first bypass flow path L2, the concentration control apparatus 200 can be used by a pressure method that, by the pressure in the mixed gas flow path L4, controls the concentration of the material gas to be supplied to the supply destination. Note that when using the concentration control apparatus 200 by the pressure system, the need for the second flow rate controller MFC 2 and the fourth opening/closing valve V4 is eliminated, and by removing them and closing the upstream side of the first bypass flow path L2, cost can also be reduced. In this case, the second bypass block b2 may be blocked to close the upstream side of the first bypass flow path L2 without removing any of the second flow rate controller MFC2 and the fourth opening/closing valve V4. To close the upstream side of the first bypass flow path L2, it is only necessary to use a part such as a cap.

When connecting the first block B1 and the second block B2, the mixed gas flow path L4 is brought into a state of being sandwiched by the second heater H2 and the third heater H3, and therefore the mixed gas is more efficiently heated. In this case, the third heater H3 is arranged along the surface in contact with outer air, and therefore the temperature of outer air is less likely to be transmitted to the mixed gas flow path L4. Incidentally, when connecting the first block B1 and the second block B2, the surface facing to the heat insulating block 300 and the panel becomes flat, thus facilitating installation.

Further, the concentration control apparatus 200 is connected to an unillustrated control part. Specifically, the two flow rate controllers MFC and the three opening/closing valves V in the first unit 210, and the opening/closing valve V, concentration detector IR, and flow rate control valve CV in the second unit 220 are respectively connected to the control part. The control part is a so-called computer having a CPU, an internal memory, an I/O buffer circuit, an AD converter, and the like. In addition, the CPU and its peripheral devices cooperate in accordance with a control program stored in a predetermined area of the internal memory, and thereby the control part fulfills a function of controlling the concentration of the material gas to be supplied to the supply destination.

Next, a method for constructing the material gas supply system 100 according to the present embodiment will be described.

First, multiple second units 220 respectively installed with concentration detectors IR whose inspection flow paths r4' are different, i.e., concentration detectors IR having different sensitivities, are prepared in advance. Then, a second unit 220 installed with a concentration detector IR having optimum sensitivity is selected in accordance with the specifications of the concentration control apparatus 200, and the selected second unit 220 is connected to the first unit 210. In this case, the upstream side of the second bypass flow path L3 and the downstream side of the second bypass flow path L3 are connected to form the second bypass flow path L3, and in accordance with a control method (pressure method or dilution method), it is selected whether to connect the upstream side of the first bypass flow path L2 and the downstream side of the first bypass flow path L2. Then, the resulting concentration control apparatus 200 is connected to the carrier gas supply device, storage tank ST, and supply destination to construct the material gas control system.

Next, operation when controlling the concentration control apparatus 200 according to the present embodiment by the dilution method will be described on the basis of FIG. 9. Note that in the concentration control apparatus 200 illustrated in FIG. 9, the flow rate control valve CV is removed in accordance with the control method.

When an operation signal is transmitted to the material gas supply system 100, the control part first opens the first opening/closing valve V1, second opening/closing valve V2, and fourth opening/closing valve V4, as well as brings the third opening/closing valve V3 into a closed state. In doing so, the carrier gas starts to be introduced into the storage tank ST via the concentration control apparatus 200, and the mixed gas starts to be supplied to the supply destination via the concentration control apparatus 200. Incidentally, the fourth opening/closing valve V4 is always in an opened state when the dilution method is used for control.

Then, the control part successively detects the concentration of the material gas flowing through the mixed gas flow path L4 by the concentration detector IR, and controls the first flow rate controller MFC 1 and the second flow rate controller MFC2 so as to bring the resulting detected concentration value close to a predetermined setting concentration value. Specifically, when the detected concentration value is higher than the setting concentration value, the control part performs control to decrease a target flow rate set in the first flow rate controller MFC1, and also to increase a target flow rate set in the second flow rate controller MFC2. In doing so, the flow rate of the carrier gas to be introduced into the storage tank ST is decreased, and also the flow rate of the carrier gas to be introduced into the mixed gas flow path L4 through the first bypass flow path L2 is increased. As a result, the degree of dilution of the mixed gas flowing through the mixed gas flow path L4 increases, and the detected concentration value detected by the concentration detector IR decreases. On the other hand, when the detected concentration value is lower than the setting concentration value, the control part performs control to increase the target flow rate set in the first flow rate controller MFC1 and also to decrease the target flow rate set in the second flow rate controller MFC2. In doing so, the flow rate of the carrier gas to be introduced into the storage tank ST is increased, and also the flow rate of the carrier gas to be introduced into the mixed gas flow path L4 through the first bypass flow path L2 is decreased. As a result, the degree of dilution of the mixed gas flowing through the mixed gas flow path L4 decreases, and the concentration value detected by the concentration detector IR increases.

Figure 10:
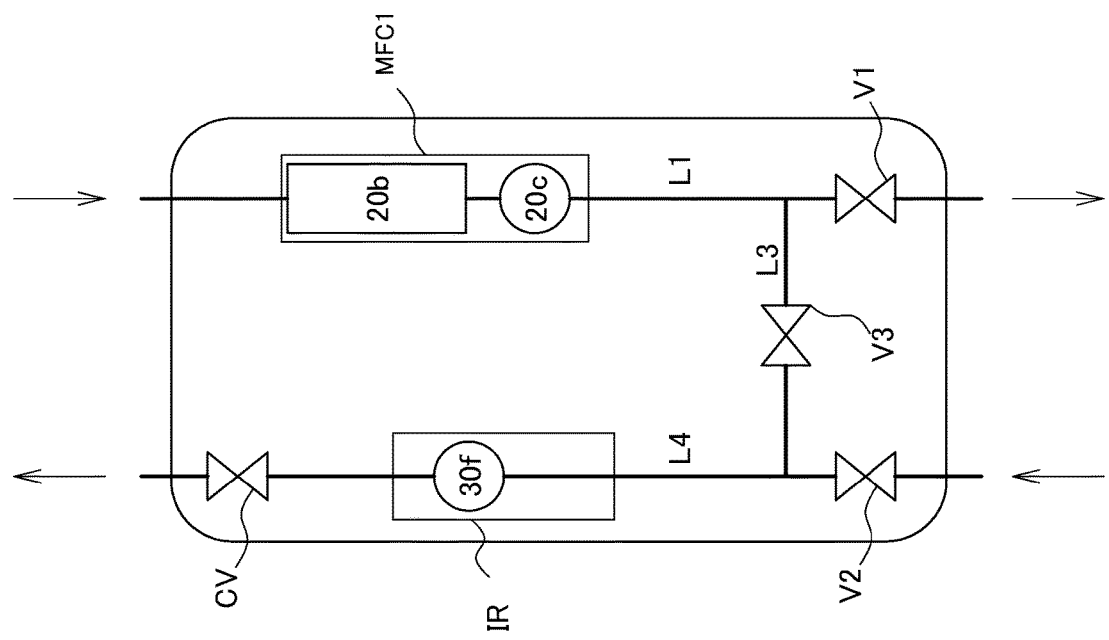
FIG. 10 is a block diagram illustrating flow paths when controlling the concentration control apparatus according to the first embodiment by a pressure method.

Next, operation when controlling the concentration control apparatus 200 according to the present embodiment by the pressure method will be described on the basis of FIG. 10. Note that in the concentration control apparatus 200 illustrated in FIG. 10, the second flow rate controller MFC2 and the fourth opening/closing valve V4 are removed in accordance with the control method.

When an operation signal is transmitted to the material gas supply system 100, the control part first opens the first opening/closing valve V1 and the second opening/closing valve V2, as well as brings the third opening/closing valve V3 into a closed state. In doing so, the carrier gas starts to be introduced into the storage tank ST via the concentration control apparatus 200, and also the mixed gas starts to be supplied to the supply destination via the concentration control apparatus 200.

Then, the control part successively detects the concentration of the material gas flowing through the mixed gas flow path L4 by the concentration detector IR, and controls the flow rate control valve CV so as to bring the resulting detected concentration value close to a predetermined setting concentration value. Specifically, when the detected concentration value is higher than the setting concentration value, the control part performs control to decrease the opening level of the flow rate control valve CV. In doing so, the concentration of the mixed gas flowing through the mixed gas flow path L4 is decreased, and the detected concentration value detected by the concentration detector IR is decreased. On the other hand, when the detected concentration value is lower than the setting concentration value, the control part performs control to increase the opening level of the flow rate control valve CV. In doing so, the concentration of the mixed gas flowing through the mixed gas flow path L4 is increased, and the concentration value detected by the concentration detector IR is increased.

In addition, in any of the control methods, when a stop signal for stopping the supply of the material gas is transmitted to the material gas supply system 100, the control part first closes the first opening/closing valve V1 and the second opening/closing valve V2, as well as brings the third opening/closing valve V3 and the fourth opening/closing valve V4 (in the case of the pressure method, the third opening/closing valve V3 only) into an opened state. In doing so, the connection between the concentration control apparatus 200 and the storage tank ST is broken to stop the supply of the material gas from the storage tank ST. Also, when a purge signal is transmitted to the material gas supply system 100, the control part performs the same control as above. In doing so, only the carrier gas thoroughly circulates through the respective flow paths L1, L2, L3, and L4 in the concentration control apparatus 200, and the concentration control apparatus 200 is purged. Therefore, the second bypass flow path L3 is preferably provided connecting between the farthest possible downstream side of the carrier gas flow path L1 and the farthest possible upstream side of the mixed gas flow path L4.

In the above-described embodiment, the concentration control apparatus 200 is assembled so that the material gas supply system 100 can be used only by any one of the dilution method and the pressure method, but may be assembled so that the material gas supply system 100 can be used by any of the control methods and the control part can perform control by any one of the control methods. In this case, it is only necessary to switch a control method by opening/closing the fourth opening/closing valve V4.

Figure 9:
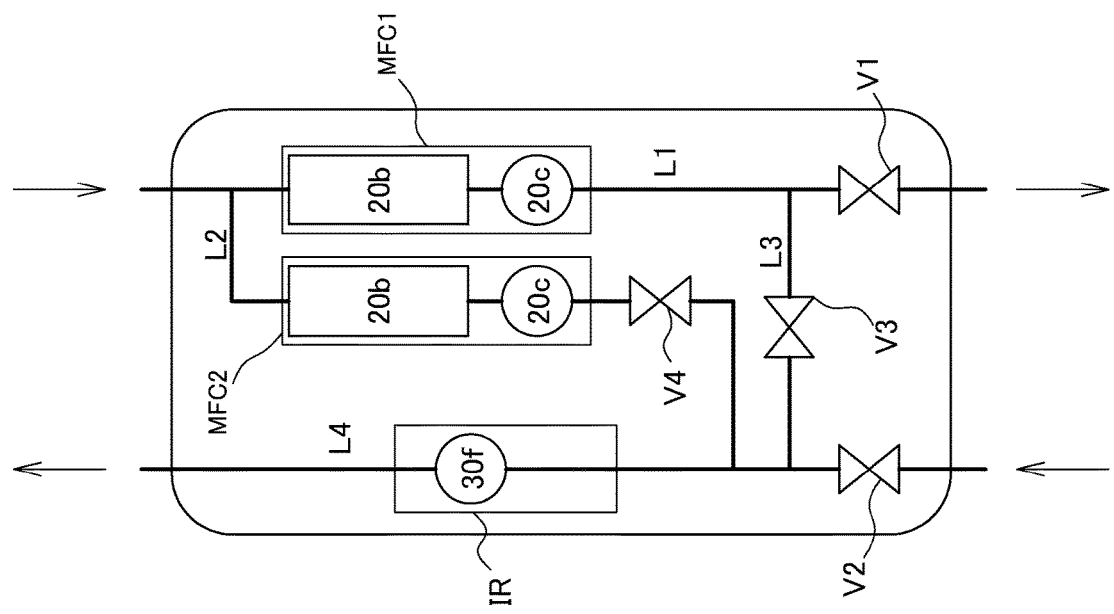
FIG. 9 is a block diagram illustrating flow paths when controlling the concentration control apparatus according to the first embodiment by a dilution method.

In addition, in the concentration control apparatus 200 illustrated in FIG. 9, pressure detected by the pressure sensor 30f can also be regarded as the secondary pressure of the concentration control apparatus 200. Therefore, a secondary pressure rise prevention function may be added to the concentration control apparatus 200 illustrated in FIG. 9 using the pressure sensor 30f. Specifically, the concentration control apparatus 200 only has to be configured such that, when a pressure value (secondary pressure) higher than a predetermined setting secondary pressure value is detected by the pressure sensor 30f, the control part brings the second opening/closing valve V2, third opening/closing valve V3, and fourth opening/closing valve V4 into a closed state (secondary pressure rise prevention state).

Even such a configuration makes it possible to prevent a situation in which the secondary side pressure of the concentration control apparatus 200 rises to break the concentration detector IR having low pressure resistance. In this case, preferably, the control part also brings the first flow rate control valve 20c, second flow rate 4 control valve 20c, and first opening/closing valve V1 into a closed state. In doing so, pressure in the internal flow paths and storage tank ST in the secondary pressure rise prevention state can be prevented from rising. Also, in this case, the concentration control apparatus 200 may be configured such that a fifth opening/closing valve (not illustrated) is installed on the upper stream side than the branch point to the first bypass flow path L2 in the carrier gas flow path L1 and the control part brings the fifth opening/closing valve into a closed state. In doing so, even when leak flow occurs from the first flow rate control valve 20c or the second flow rate control valve 20c, pressure in the internal flow paths can be surely prevented from rising.

Further, preferably, a sixth opening/closing valve (not illustrated) is installed on the lower stream side than the pressure sensor 30f in the mixed gas flow path L4, and when after establishing the secondary pressure rise prevention state, the pressure value detected by the pressure sensor 30f rises, the control part also brings the sixth opening/closing valve into a closed state. In doing so, a rise in pressure in the internal flow paths due to a rise in pressure on the lower stream side than the sixth opening/closing valve can be prevented. Also, in this case, when installing a fourth pressure sensor (not illustrated) on the downstream side (secondary side) of the concentration control apparatus 200, by comparing a pressure value between the pressure sensor 30f and the fourth pressure sensor, the concentration control apparatus 200 can be automatically restored from the secondary pressure rise prevention state to the concentration control state.

Second Embodiment

Figure 11:
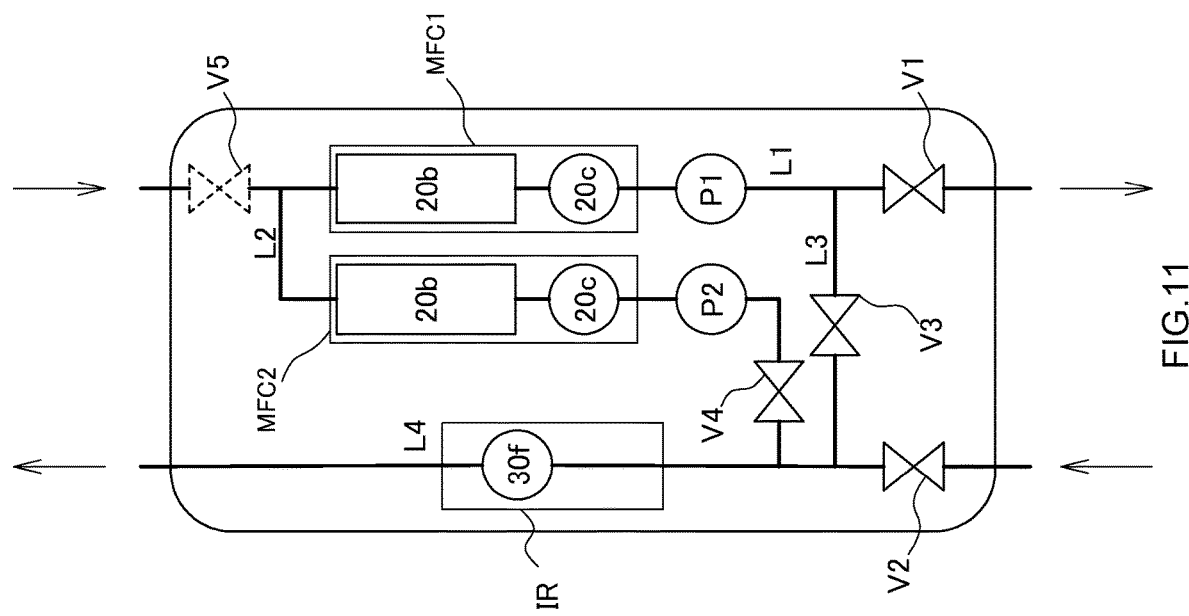
FIG. 11 is a block diagram illustrating flow paths of a concentration control apparatus according to a second embodiment.

The present embodiment is a variation of the concentration control apparatus 200 according to the first embodiment, and is one in which an internal pressure rise prevention function is added to the concentration control apparatus 200 illustrated in FIG. 9. Specifically, as illustrated in FIG. 11, the concentration control apparatus 200 according to the present embodiment is one configured such that the concentration control apparatus 200 illustrated in FIG. 9 is further installed with: a first pressure sensor P1 on the downstream side of the flow rate controller MFC1 in the carrier gas flow path L1; and a second pressure sensor P2 on the downstream side of the flow rate controller MFC 2 in the first bypass flow path L2. More specifically, the first pressure sensor P1 is installed on the upper stream side than the first opening/closing valve V1 in the carrier gas flow path L1, and the second pressure sensor P2 is installed on the upper stream side than the fourth opening/closing valve V4 in the first bypass flow path L2.

In addition, the concentration control apparatus 200 is configured such that when the first pressure sensor P1 detects a pressure value higher than a predetermined setting internal pressure value, the control part brings the first flow rate control valve 20c of the flow rate controller MFC1, the first opening/closing valve V1, the second opening/closing valve V2, and the fourth opening/closing valve V4 into a closed state, as well as brings the third opening/closing valve V3 into an opened state (internal pressure rise prevention state). In doing so, the downstream side of the flow rate controller MFC1 in the carrier gas flow path L1 is exhausted by a pump (not illustrated) connected to the downstream side of the concentration control apparatus 200, and thereby internal pressure is reduced.

Also, the concentration control apparatus 200 is configured such that when the second pressure sensor P2 detects a pressure value higher than a predetermined setting internal pressure value, the control part brings the second flow rate control valve 20c of the flow rate controller MFC2, the first opening/closing valve V1, the second opening/closing valve V2, and the third opening/closing valve V3 into a closed state, as well as brings the fourth opening/closing valve V4 into an opened state (internal pressure rise prevention state). In doing so, the downstream side of the flow rate controller MFC2 in the first bypass flow path L2 is exhausted by the pump, and thereby the internal pressure is reduced.

Such a configuration makes it possible to prevent a situation in which the internal pressure of the concentration control apparatus 200 rises to break the concentration detector IR having low pressure resistance. Incidentally, in this case, preferably, a fifth opening/closing valve V5 (in FIG. 11, indicated by a dashed line) is installed on the upper stream side than the branch point to the first bypass flow path L2 in the carrier gas flow path L1, and when the first pressure sensor P1 or the second pressure sensor P2 detects a pressure value higher than a corresponding one of the predetermined setting internal pressure values, the fifth opening/closing valve V5 is also brought into a closed state.

Third Embodiment

Figure 12:
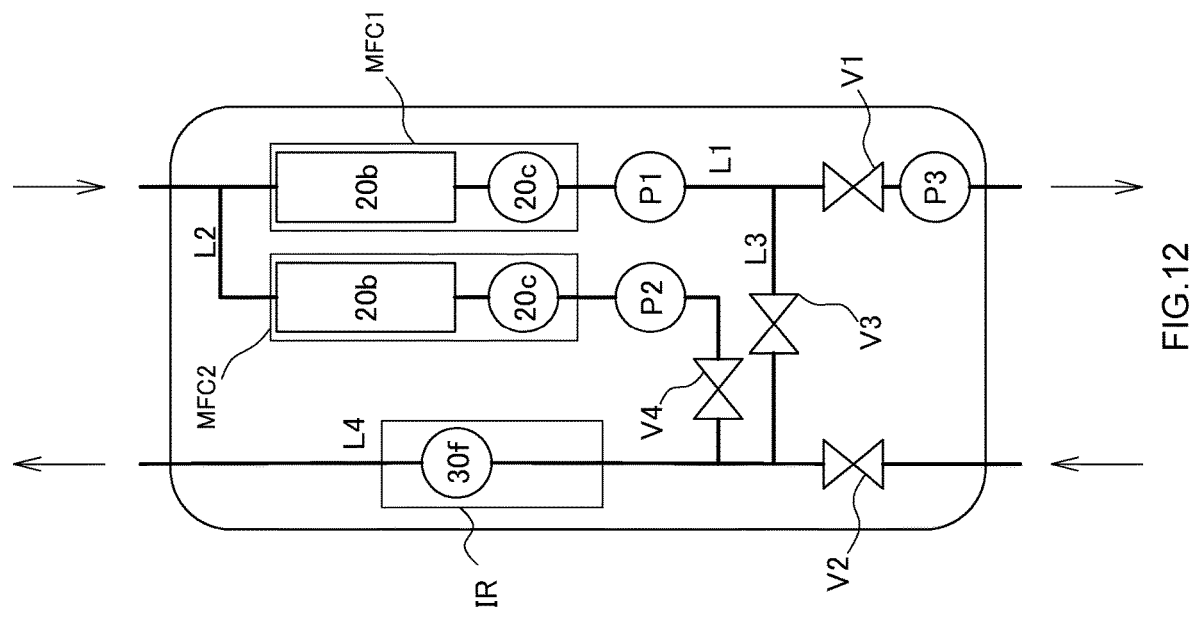
FIG. 12 is a block diagram illustrating flow paths of a concentration control apparatus according to a third embodiment.

The present embodiment is a variation of the concentration control apparatus 200 according to the first embodiment, and one configured such that a backflow prevention function is added to the concentration control apparatus 200 illustrated in FIG. 9. Specifically, as illustrated in FIG. 12, the concentration control apparatus 200 according to the present embodiment is one configured such that the concentration control apparatus 200 illustrated in FIG. 9 is further installed with: a pressure sensor P1 on the downstream side of the flow rate controller MFC1 in the carrier gas flow path L1 and on the upper stream side than the first opening/closing valve V1; a third pressure sensor P3 on the lower stream side than the first opening/closing valve V1; and a second pressure sensor P2 on the downstream side of the flow rate controller MFC2 in the first bypass flow path L2 and on the upper stream side than the fourth opening/closing valve V4.

In addition, the concentration control apparatus 200 is configured such that when the pressure value of the third pressure sensor P3 is larger than the pressure value of the first pressure sensor P1, the control part keeps the first opening/closing valve V1 in a closed state. Such a configuration makes it possible to prevent the material stored in the storage tank ST from flowing back into the concentration control apparatus 200.

Also, the concentration control apparatus 200 is configured such that when the pressure value of the pressure sensor 30f is larger than the pressure value of the first pressure sensor P1, the control part keeps the third opening/closing valve V3 in a closed state, and when the pressure value of the pressure sensor 30f is larger than the pressure value of the second pressure sensor P2, the control part keeps the fourth opening/closing valve V4 in a closed state. Such a configuration makes it possible to prevent the mixed gas flowing through the mixed gas flow path L4 from flowing back to the carrier gas flow path L1 and to the first bypass flow path L2.

Fourth Embodiment

The present embodiment is a variation of the concentration control apparatus 200 according to the first embodiment, and one configured such that a cycle purge function to be used when replacing the storage tank is added to the concentration control apparatus 200 illustrated in FIG. 9. Specifically, the concentration control apparatus 200 according to the present embodiment is one configured such that the concentration control apparatus 200 illustrated in FIG. 9 is further installed with a fifth opening/closing valve V5 on the upper stream side than the branch point to the first bypass flow path L2 in the carrier gas flow path L1 (see FIG. 11).

In addition, the concentration control apparatus 200 is configured such that when replacing the storage tank ST, on-off valves (not illustrated) installed in the introduction pipe 11 and lead-out pipe 12 of the storage tank ST are brought into a closed state, and then when a user inputs a storage tank ST replacement signal, the control part having received the replacement signal brings the first flow rate control valve 20c, second flow rate control valve 20c, first opening/closing valve V1, second opening/closing valve V2, third opening/closing valve V3, and fourth opening/closing valve V4 into an opened state, and then repeats opening/closing the fifth opening/closing valve V5 at predetermined time intervals. In doing so, when opening the fifth opening/closing valve V5, the concentration control apparatus 200 is purged with the carrier gas, whereas when closing the fifth opening/closing valve V5, the concentration control apparatus 200 is evacuated by the pump, and by repeating these steps, a cycle purge is performed.

In addition, in the present embodiment, the cycle purge is performed by repeating opening/closing the fifth opening/closing valve V5, but may be performed in such a manner that, without installing the fifth opening/closing valve V5, the control part brings the first opening/closing valve V1, second opening/closing valve V2, third opening/closing valve V3, and fourth opening/closing valve V4 into an opened state, and then simultaneously repeats opening/closing the first flow rate control valve 20c and the second flow rate control valve 20c.

Also, the present embodiment may be added with a zero point adjustment function for the first flow rate sensor 20b and second flow rate sensor 20b. Specifically, the concentration control apparatus 200 only has to be configured such that when adjusting the zero point of the first flow rate sensor 20b, the control part having received a zero point adjustment start signal for the first flow rate sensor 20b brings the first opening/closing valve V1, third opening/closing valve V3, and fifth opening/closing valve V5 into a closed state, and adjusts the zero point of the first flow rate sensor 20b. Also, the concentration control apparatus 200 only has to be configured such that when adjusting the zero point of the second flow rate sensor 20b, the control part having received a zero point adjustment start signal for the second flow rate sensor 20b brings the fourth opening/closing valve V4 and the fifth opening/closing valve V5 into a closed state, and adjusts the zero point of the second flow rate sensor 20b.

Fifth Embodiment

Figure 13:
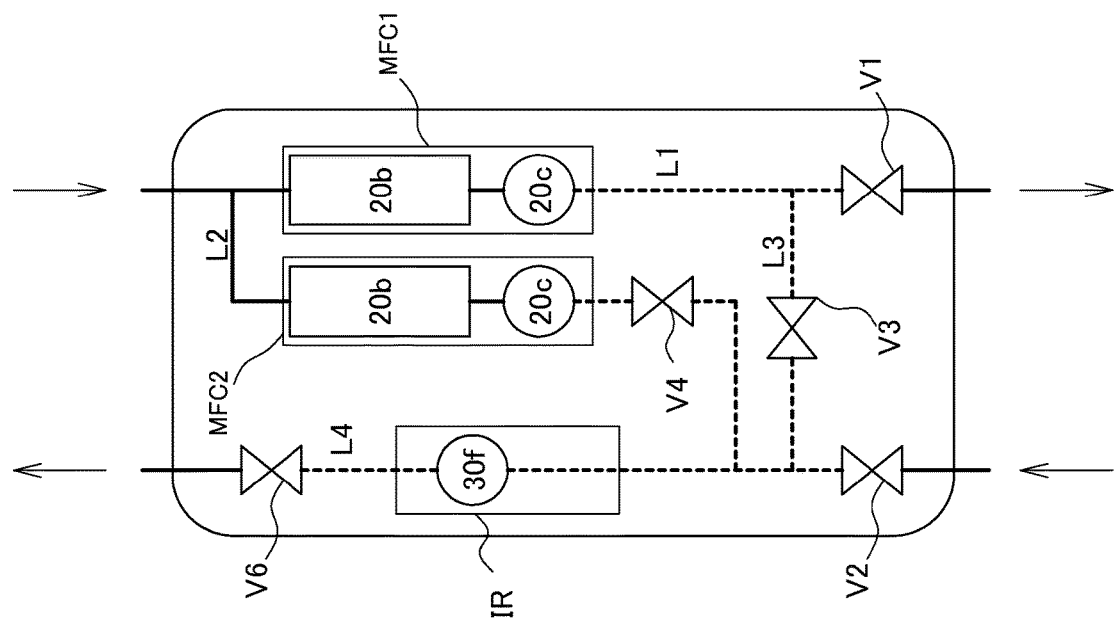
FIG. 13 is a block diagram illustrating flow paths of a concentration control apparatus according to a fifth embodiment.

The present embodiment is a variation of the concentration control apparatus 200 according to the first embodiment, and one configured such that a calibration function for the flow rate controllers MFC1 and MFC2 is added to the concentration control apparatus 200 illustrated in FIG. 9. Specifically, as illustrated in FIG. 13, the concentration control apparatus 200 according to the present embodiment is one configured such that the concentration control apparatus 200 illustrated in FIG. 9 is further installed with a sixth opening/closing valve V6 on the lower stream side than the pressure sensor 30f.

In addition, in this case, the volume of a synthetic flow path in which the flow path from the first flow rate control valve 20c to the first opening/closing valve V1 in the carrier gas flow path L1, the flow path on the lower stream side than the second flow rate control valve 20c in the first bypass flow path L2, the flow path of the second bypass flow path L3, and the flow path from the second opening/closing valve V2 to the sixth opening/closing valve V6 in the mixed gas flow path L4 are synthesized (in FIG. 13, indicated by dashed lines) is preliminarily calculated.

In this case, the concentration control apparatus 200 only has to be configured such that when calibrating the flow rate controller MFC1, the control part having received a calibration start signal for the flow rate controller MFC1 closes the first flow rate control valve 20c, second flow rate control valve 20c, first opening/closing valve V1, and second opening/closing valve V2, as well as brings the third opening/closing valve V3 and the fourth opening/closing valve V4 into an opened state to evacuate the concentration control apparatus 200 by the pump for a predetermined time, then closes the sixth opening/closing valve V6 to establish a calibration preparation state, and subsequently opens the first flow rate control valve 20c in the calibration preparation state to calibrate the flow rate controller MFC1 with reference to the flow rate value of the first flow rate sensor 20b, the pressure value of the pressure sensor 30f, and the volume of the synthetic flow path.

Also, the concentration control apparatus 200 only has to be configured such when calibrating the flow rate controller MFC2 on the other hand, the control part having received a calibration start signal for the flow rate controller MFC2 establishes the calibration preparation state in the same manner as above, and subsequently opens the second flow rate control valve 20c in the calibration preparation state to calibrate the flow rate controller MFC2 with reference to the flow rate value of the second flow rate sensor 20b, the pressure value of the pressure sensor 30f, and the volume of the synthetic flow path.

In addition, in this case, by installing a temperature sensor, and referring to a temperature value detected by the temperature sensor when calibrating the flow rate controller MFC1 or MFC2, more highly accurate calibration can be performed.

OTHER EMBODIMENTS

Figure 14:
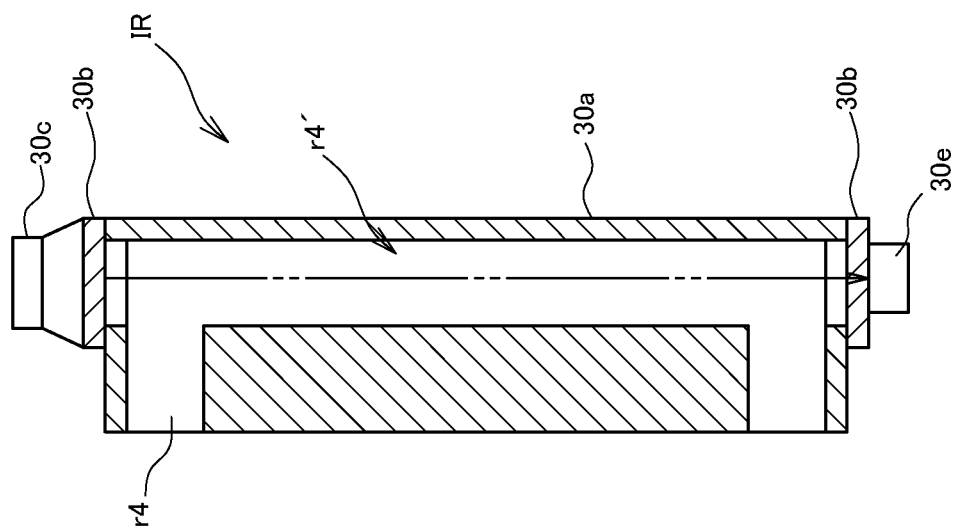
FIG. 14 is a schematic cross-sectional view illustrating a concentration detector according to another embodiment.

As another embodiment, in place of the concentration detector IR in the above-described embodiments, a concentration detector IR illustrated in FIG. 14 may be used. The concentration detector IR illustrated in FIG. 14 is different in configuration from the concentration detector IR in the above-described embodiments in that the reflective mirror 30d is not provided. Accordingly, in the concentration detector IR, light emitted from a light source 30c is linearly incident on a light receiver 30e. In such a configuration, since the reflective mirror 30d is not provided, manufacturing cost can be suppressed.

Figure 15:
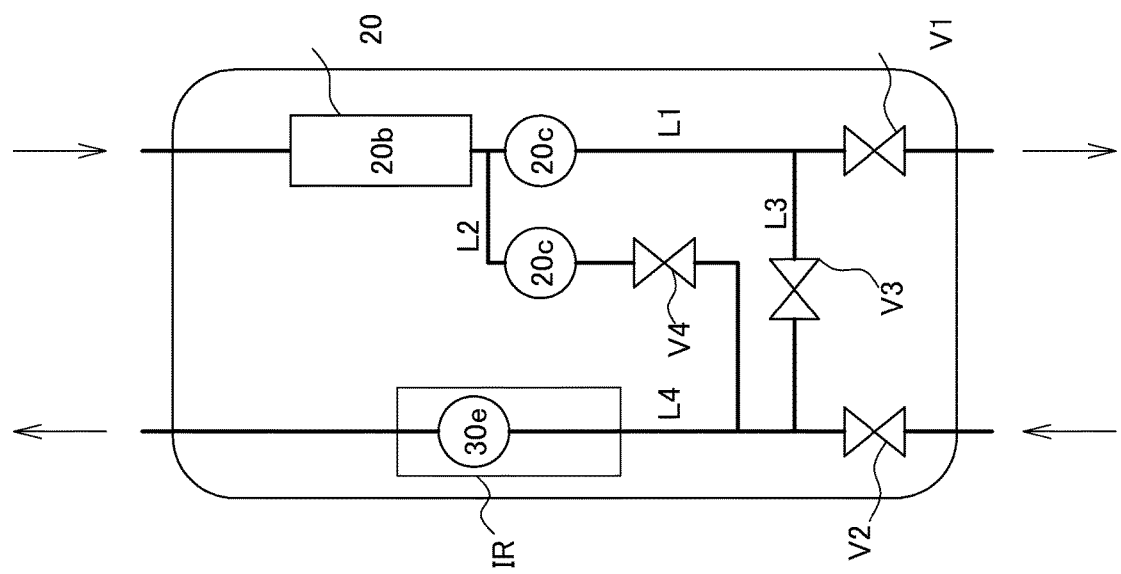
FIG. 15 is a block diagram illustrating flow paths when controlling a concentration control apparatus according to still another embodiment by the dilution method.

As still another embodiment, as illustrated in FIG. 15, the first bypass flow path L2 in the above-described embodiments may be branched from between a flow rate sensor 20b and a flow rate control valve 20c installed on the downstream side of the flow rate sensor 20b. In this case, the first bypass flow path L2 is installed with the flow rate control valve 20c and a fourth opening/closing valve V4. In addition, the concentration control apparatus 200 only has to be configured such that the control part controls the concentration of the material gas flowing through the mixed gas flow path L4 with reference to the total value and ratio of target flow rates of the flow rate control valves 20c installed in the carrier gas flow path L1 and in the first bypass flow path L2. In such a configuration, the need to install a flow rate sensor 20b in the first bypass flow path L2 is eliminated, and therefore control cost can be suppressed.

Yet another embodiment may be configured to install a pair of heaters to sandwich the carrier gas flow path L1 in the first block B1 and also install a pair of heaters to sandwich the mixed gas flow path L4 in the second block B2.

Further, a temperature control part that, when heating the respective heaters installed in the first and second blocks B1 and B2, controls the heaters closer to the mixed gas flow path L4 to have higher temperature than the heaters closer to the carrier gas flow path L1 may be provided.

In addition, in the concentration detector IR in each of the above-described embodiments, by curving the reflective surface of the reflective mirror 30*d* in a concave shape to condense light on the light receiver 30*e*, the sensitivity of the concentration detector 30 is increased.

Figure 16:
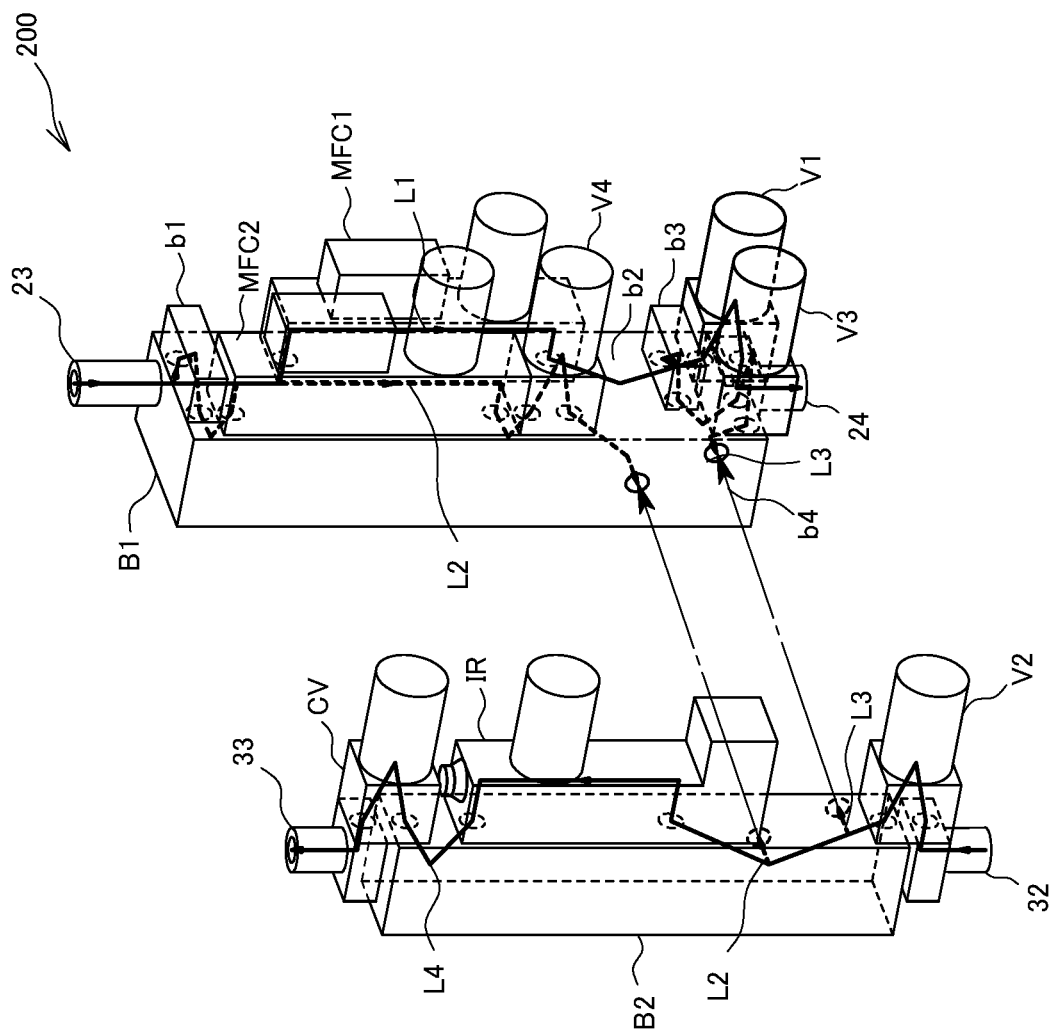
FIG. 16 is a perspective view illustrating a concentration control apparatus according to yet another embodiment.

Also, each of the above-described embodiments is configured such that the upstream side of the first bypass flow path L2 and the downstream side of the first bypass flow path L2 are connected via the bypass block b, and the upstream side of the second bypass flow path L3 and the downstream side of the second bypass flow path L3 are connected via the bypass block b. However, as illustrated in FIG. 16, it may be configured that the upstream side of the first bypass flow path L2 and the upstream side of the second bypass flow path L3 are opened in the outer surface of the first block B1 opposite to the second block B2, and the downstream side of the first bypass flow path L2 and the downstream side of the second bypass flow path L3 are opened in the outer surface of the second block B2 opposite to the first block B1. In doing so, by connecting the first block B1 and the second block B2, the upstream side of the first bypass flow path L2 and the downstream side of the first bypass flow path L2 can be communicated without the bypass block b, and also the upstream side of the second bypass flow path L3 and the downstream side of the second bypass flow path L3 can be communicated without the bypass block b.

Further, in each of the above-described embodiments, as the first block B1 and the second block B2, different blocks are employed, but an integrated block may be employed. In this case, the second unit 220 likely to be contaminated by the material gas cannot be attached/detached with respect to the first unit 210, and therefore maintainability is not improved. However, as compared with the above-described conventional concentration control apparatus, the installability of heaters is greatly improved.

Specific embodiment is a concentration control apparatus adapted to control the flow rate of carrier gas to be introduced into a storage tank storing a material and control the concentration of material gas that is led out of the storage tank as mixed as with the carrier gas and results from vaporization of the material, and the concentration control apparatus includes: a block having inside a carrier gas flow path through which the carrier gas flows and a mixed gas flow path through which the mixed gas flows; a first flow rate sensor that detects the flow rate of the carrier gas flowing through the carrier gas flow path; a first flow rate control valve that, on the basis of the detected value of the first flow rate sensor, controls the flow rate of the carrier gas flowing through the carrier gas flow path; and a concentration detector that detects the concentration of the material gas flowing through the mixed gas flow path. In addition, the block is provided inside with a heater.

In this case, the heater incorporated in the block is preferably arranged along at least one of the carrier gas flow path L1 and the mixed gas flow path L4. In addition, in general, it is necessary to heat the material gas (mixed gas) flowing through the mixed gas flow path L4 at higher temperature than the carrier gas flowing through the carrier gas flow path L1, and therefore when arranging the heater along any one of the carrier gas flow path L1 and the mixed gas flow path L4, the heater is preferably arranged closer to the mixed gas flow path L4 than the carrier gas flow path L1. Heaters may of course be arranged along the carrier gas flow path L1 and the mixed gas flow path L4.

Also, the heater is preferably arranged along an outer surface of the block on the outer side than the carrier gas flow path L1 and the mixed gas flow path L4. Arranging in this manner makes it possible to block cool air transmitted from outer air to the block before temperature reduction due to the cool air transmits to each of the flow paths. In addition, as a heater installation method, for example, a configuration adapted to install a rod-like heater by inserting it into an insertion hole formed by cutting the first block B1 or the second block B2 is conceivable.

Also, in this case, when using the concentration control apparatus 200 by the dilution method, as in the case of connecting the first block B1 and the second block B2 in each of the above-described embodiments, inside the block, the first bypass flow path L2 may be formed, and the second bypass flow path L3 may be formed. In addition, as in each of the above-described embodiments, the first bypass flow path L2 and the second bypass flow path L3 are installed with the respective devices necessary to use the concentration control apparatus 200 by the dilution method. On the other hand, when using the concentration control apparatus 200 by the pressure method, as in the case of connecting the first block B1 and the second block B2 in each of the above-described embodiments, the second bypass flow path L3 may be formed. In addition, as in each of the above-described embodiments, the second bypass flow path L3 is installed with the respective devices necessary to use the concentration control apparatus 200 by the pressure method.

In the above-described embodiments, a structure adapted to branch from the carrier gas flow path L1 and directly merge with the mixed gas flow path L4 is employed as the second bypass flow path L3. However, without limitation to this, a structure adapted to branch from the carrier gas flow path L1 and merge with the mixed gas flow path L4 via the first bypass flow path L2 may be employed. In this case, the upstream side of the second bypass flow path L3 may be merged with the first bypass flow path L2 to complete the merge within the first block B1, or the downstream side of the second bypass flow path L3 may be merged with the first bypass flow path L2 to complete the merge within the second block B2.

Further, in the first embodiment, parts of the opening/closing valves, flow rate control valves, and flow rate sensors installed in the first unit 210 and the second unit 220 may be installed in the respective pipes connected to the first unit 210 and the second unit 220. Specifically, for example, the first flow rate sensor 20*b* installed in the first unit 210 may be installed in the middle of the pipe connecting the carrier gas supply device and the first unit 210, or the first opening/closing valve V1 installed in the first unit 210 may be installed in the middle of the pipe connecting the first unit 210 and the storage tank ST. Further, the flow rate control valve CV installed in the second unit 220 may be installed in the middle of the pipe connecting the second unit 220 and the supply destination, or the second opening/closing valve V2 installed in the second unit 220 may be installed in the middle of the pipe connecting the storage tank ST and the second unit 220.

Also, the above-described embodiments may be configured to preliminarily grasp the amount of the material stored in the storage tank ST, after connecting the concentration control apparatus 200 to the storage tank ST, successively store the concentration value of the mixed gas detected by the concentration detector IR and the flow rate values of the carrier gas measured by the first flow rate sensor 20b and second flow rate sensor 20b, and from these values, calculate the lead-out amount of the material led out of the storage tank ST. In doing so, when the lead-out amount of the material led out of the storage tank ST reaches a prescribed amount, a user can be alerted. This enables a user to know the appropriate replacement time of the storage tank ST Besides, it should be appreciated that the present invention is not limited to any of the above-described embodiments, but can be variously modified without departing from the scope of the present invention.

REFERENCE SIGNS LIST

100: Material gas supply system
ST: Storage tank
200: Concentration control apparatus
210: First unit
B1: First block
MFC1, MFC2: Flow rate controller
20b: First flow rate sensor, Second flow rate sensor
20c: First flow rate control valve, Second flow rate control valve
V1: First opening/closing valve
V2: Second opening/closing valve
V3: Third opening/closing valve
V4: Fourth opening/closing valve
L1: Carrier gas flow path
L2: First bypass flow path
L3: Second bypass flow path
220: Second unit
B2: Second block
IR: Concentration detector
30c: Light source
30e: Light receiver
30d: Reflective mirror
CV: Flow rate control valve
30f: Pressure sensor
P1: Pressure sensor
P2: Pressure sensor
P3: Pressure sensor
L4: Mixed gas flow path

The invention claimed is:

1. A concentration control apparatus adapted to introduce carrier gas into a storage tank storing a material, and control concentration of material gas that is led out of the storage tank as mixed gas with the carrier gas and results from vaporization of the material, the concentration control apparatus comprising:
a first unit that controls a flow rate of the carrier gas to be introduced into the storage tank; and
a second unit that detects the concentration of the material gas led out of the storage tank, wherein
the first unit comprises:
a first block having inside a carrier gas flow path through which the carrier gas flows;
a first flow rate sensor that detects the flow rate of the carrier gas flowing through the carrier gas flow path; and
a first flow rate control valve that on a basis of a detected value of the first flow rate sensor, controls the flow rate of the carrier gas flowing through the carrier gas flow path, and the second unit comprises:
a second block that has inside a mixed gas flow path through which the mixed gas flows and is attachably and detachably connected to the first block; and
a concentration detector that detects the concentration of the material gas flowing through the mixed gas flow path, wherein
in a state where the first block and the second block are connected so as to face each other, a first bypass flow path is formed which branches from an upper stream side of the first flow rate control valve in the carrier gas flow path and merges with an upper stream side of the concentration detector in the mixed gas flow path, and
opposing surfaces of the first block and the second block each have a port of the first bypass flow path.

2. The concentration control apparatus according to claim 1, wherein
the second unit further comprises a third flow rate control valve that controls a flow rate of the mixed gas flowing through the mixed gas flow path,
the concentration control apparatus being configured to, on a basis of a detected value of the concentration detector, control the concentration of the material gas flowing through the mixed gas flow path by the third flow rate control valve.

3. The concentration control apparatus according to claim 1, wherein
the concentration detector comprises:
a light source that irradiates the mixed gas flowing through the mixed gas flow path with light; and
a light receiver that detects light that transmitted through the mixed gas after emission from the light source.

4. The concentration control apparatus according to claim 3, wherein
the concentration detector further comprises a reflective mirror that, in a direction away from the second block, bends the light that transmitted through the mixed gas after the emission from the light source.

5. The concentration control apparatus according to claim 1, wherein
at least one of the first block and the second block is provided inside with a heater.

6. A material gas supply system comprising:
the concentration control apparatus according to claim 1; and
the storage tank connected to the concentration control apparatus.

7. A concentration control apparatus adapted to introduce carrier gas into a storage tank storing a material, and control concentration of material gas that is led out of the storage tank as mixed gas with the carrier gas and results from vaporization of the material, the concentration control apparatus comprising:
a first unit that controls a flow rate of the carrier gas to be introduced into the storage tank; and
a second unit that detects the concentration of the material gas led out of the storage tank, wherein
the first unit comprises:
a first block having inside a carrier gas flow path through which the carrier gas flows:
a first flow rate sensor that detects the flow rate of the carrier gas flowing through the carrier gas flow path; and
a first flow rate control valve that on a basis of a detected value of the first flow rate sensor, controls the flow rate of the carrier gas flowing through the carrier gas flow path, and the second unit comprises:
- a second block that has inside a mixed gas flow path through which the mixed gas flows and is attachably and detachably connected to the first block; and
- a concentration detector that detects the concentration of the material gas flowing through the mixed gas flow path, the concentration control apparatus configured to, when connecting the first block and the second block, be able to form a first bypass flow path that branches from an upper stream side than the first flow rate control valve in the carrier gas flow path and merges with an upper stream side than the concentration detector in the mixed gas flow path, wherein when connecting the first block and the second block to form the first bypass flow path, the first bypass flow path branches from an upper stream side than the first flow rate sensor in the carrier gas flow path, and the first unit or the second unit further comprises:
- a second flow rate sensor that detects a flow rate of the carrier gas flowing through the first bypass flow path; and
- a second flow rate control valve that controls the flow rate of the carrier gas flowing through the first bypass flow path, the concentration control apparatus being configured to, on a basis of detected values of the concentration detector and the second flow rate sensor, and the detected value of the first flow rate sensor, control the concentration of the material gas flowing through the mixed gas flow path by the first flow rate control valve and the second flow rate control valve.

8. The concentration control apparatus according to claim 7, wherein
the first unit further comprises a fifth opening/closing valve on an upper stream side than a branch point to the first bypass flow path in the carrier gas flow path,
the concentration control apparatus being configured to, when receiving a replacement signal for the storage tank, open/close the fifth opening/closing valve at predetermined time intervals.

9. The concentration control apparatus according to claim 7, further comprising
an alert function that issues an alert when a lead-out amount of the material led out of the storage tank reaches a predetermined prescribed amount, the lead-out amount being calculated on a basis of a detected value detected by the concentration detector, the detected value detected by the first flow rate sensor, and a detected value detected by a second flow rate sensor.

10. A concentration control apparatus adapted to introduce carrier gas into a storage tank storing a material, and control concentration of material gas that is led out of the storage tank as mixed gas with the carrier gas and results from vaporization of the material, the concentration control apparatus comprising:
- a first unit that controls a flow rate of the carrier gas to be introduced into the storage tank; and
- a second unit that detects the concentration of the material gas led out of the storage tank, wherein the first unit comprises:
- a first block having inside a carrier gas flow path through which the carrier gas flows;
- a first flow rate sensor that detects the flow rate of the carrier gas flowing through the carrier gas flow path; and
- a first flow rate control valve that on a basis of a detected value of the first flow rate sensor, controls the flow rate of the carrier gas flowing through the carrier gas flow path, and the second unit comprises:
- a second block that has inside a mixed gas flow path through which the mixed gas flows and is attachably and detachably connected to the first block; and
- a concentration detector that detects the concentration of the material gas flowing through the mixed gas flow path, the concentration control apparatus configured to, when connecting the first block and the second block, be able to form a first bypass flow path that branches from an upper stream side than the first flow rate control valve in the carrier gas flow path and merges with an upper stream side than the concentration detector in the mixed gas flow path, wherein when connecting the first block and the second block to form the first bypass flow path, the first bypass flow path branches from a lower stream side than the first flow rate sensor in the carrier gas flow path, and the first unit or the second unit further comprises
a second flow rate control valve that controls a flow rate of the carrier gas flowing through the first bypass flow path, the concentration control apparatus being configured to, on a basis of a detected value of the concentration detector and the detected value of the first flow rate sensor, control the concentration of the material gas flowing through the mixed gas flow path by the first flow rate control valve and the second flow rate control valve.

11. A concentration control apparatus adapted to introduce carrier gas into a storage tank storing a material, and control concentration of material gas that is led out of the storage tank as mixed gas with the carrier gas and results from vaporization of the material, the concentration control apparatus comprising:
- a first unit that controls a flow rate of the carrier gas to be introduced into the storage tank; and
- a second unit that detects the concentration of the material gas led out of the storage tank, wherein the first unit comprises:
- a first block having inside a carrier gas flow path through which the carrier gas flows;
- a first flow rate sensor that detects the flow rate of the carrier gas flowing through the carrier gas flow path; and
- a first flow rate control valve that on a basis of a detected value of the first flow rate sensor, controls the flow rate of the carrier gas flowing through the carrier gas flow path, and the second unit comprises:
- a second block that has inside a mixed gas flow path through which the mixed gas flows and is attachably and detachably connected to the first block; and
- a concentration detector that detects the concentration of the material gas flowing through the mixed gas flow path, the concentration control apparatus configured to, when connecting the first block and the second block, be able to form a first bypass flow path that branches from an upper stream side than the first flow rate control valve in the carrier gas flow path and merges with an upper stream side than the concentration detector in the mixed gas flow path, wherein when connecting the first block and the second block to form the first bypass flow path, the first bypass flow path branches from an upper stream side than the first flow rate sensor in the carrier gas flow path, and the first unit or the second unit further comprises:
- a second flow rate sensor that detects a flow rate of the carrier gas flowing through the first bypass flow path; and
- a second flow rate control valve that controls the flow rate of the carrier gas flowing through the first bypass flow path, the concentration control apparatus being configured to, on a basis of detected values of the concentration detector and the second flow rate sensor, and the detected value of the first flow rate sensor, control the concentration of the material gas flowing through the mixed gas flow path by the first flow rate control valve and the second flow rate control valve, wherein the concentration control apparatus is configured to, when connecting the first block and the second block, be able to form a second bypass flow path that branches from a lower stream side than the first flow rate control valve in the carrier gas flow path and merges with any of the mixed gas flow path and the first bypass flow path.

12. The concentration control apparatus according to claim 11, wherein when connecting the first block and the second block to form the second bypass flow path, the first unit further comprises a first opening/closing valve on a lower stream side than a branch point of the second bypass flow path in the carrier gas flow path, the second unit further comprises a second opening/closing valve on an upper stream side than a branch point of the second bypass flow path in the mixed gas flow path, and the first unit or the second unit further comprises a third opening/closing valve in the second bypass flow path.

13. The concentration control apparatus according to claim 12, wherein the second unit further comprises a pressure sensor that detects pressure in the mixed gas flow path.

14. The concentration control apparatus according to claim 13, wherein the first unit or the second unit further comprises a fourth opening/closing valve on a lower downstream side than the second flow rate control valve in the first bypass flow path.

15. The concentration control apparatus according to claim 14, configured to, when a detected value of the pressure sensor is larger than a predetermined setting pressure value, bring the second opening/closing valve, the third opening/closing valve, and the fourth opening/closing valve into a closed state.

16. The concentration control apparatus according to claim 14, wherein the first unit further comprises a first pressure sensor that detects pressure on the lower stream side than the first flow rate control valve and on an upper stream side than the first opening/closing valve in the carrier gas flow path, and the first unit or the second unit further comprises a second pressure sensor that detects pressure on a lower stream side than the second flow rate control valve and on an upper stream side than the fourth opening/closing valve in the first bypass flow path, the concentration control apparatus being configured to, when a detected value of the first pressure sensor is larger than a predetermined setting internal pressure value, bring the first flow rate control valve, the first opening/closing valve, the second opening/closing valve, and the fourth opening/closing valve into a closed state, as well as bring the third opening/closing valve into an opened state, and when a detected value of the second pressure sensor is larger than the setting internal pressure value, bring the second flow rate control valve, the first opening/closing valve, the second opening/closing valve, and the third opening/closing valve into a closed state, as well as bring the fourth opening/closing valve into an opened state.

17. The concentration control apparatus according to claim 14, wherein the first unit further comprises: a first pressure sensor that detects pressure on the lower stream side than the first flow rate control valve and on an upper stream side than the first opening/closing valve in the carrier gas flow path; and a third pressure sensor that detects pressure on a lower stream side than the first opening/closing valve, and the first unit or the second unit further comprises a second pressure sensor that detects pressure on a lower stream side than the second flow rate control valve and on an upper stream side than the fourth opening/closing valve in the first bypass flow path, the concentration control apparatus being configured to, when a detected value of the first pressure sensor is smaller than a detected value of the third pressure sensor, keep the first opening/closing valve in a closed state, when the detected value of the first pressure sensor is smaller than a detected value of a pressure sensor, keep the third opening/closing valve in a closed state, and when a detected value of the second pressure sensor is smaller than the detected value of the pressure sensor, keep the fourth opening/closing valve in a closed state.

18. The concentration control apparatus according to claim 14, wherein the first unit further comprises a fifth opening/closing valve on an upper stream side than a branch point to the first bypass flow path in the carrier gas flow path, the concentration control apparatus being configured to, when receiving a zero point adjustment signal for the first flow rate sensor, adjust a zero point of the first flow rate sensor with the first opening/closing valve, the third opening/closing valve, and the fifth opening/closing valve in a closed state, and when receiving a zero point adjustment signal for the second flow rate sensor, adjust a zero point of the second flow rate sensor with the fourth opening/closing valve and the fifth opening/closing valve in a closed state.

19. The concentration control apparatus according to claim 14, wherein the second unit further comprises a sixth opening/closing valve installed on a downstream side of the concentration detector in the mixed gas flow path, the concentration control apparatus being configured to, when receiving a calibration signal for a flow rate controller that on the basis of the detected value detected by the first flow rate sensor, controls the first flow rate control valve, bring the first flow rate control valve into an opened state from a state where a synthetic flow path consisting of: a flow path from the first flow rate control valve to the first opening/closing valve in the carrier gas flow path; a flow path on a downstream side of the second flow rate control valve in the first bypass flow path; the second bypass flow path; and a flow path from the second opening/closing valve to the sixth opening/closing valve in the mixed gas flow path is depressurized inside, and calibrate the first flow rate sensor on a basis of volume of the synthetic flow path, the detected value of the first flow rate sensor, and a detected value of a pressure sensor, and when receiving a calibration signal for a flow rate controller that on a basis of a detected value detected by the second flow rate sensor, controls the second flow rate control valve, bring the second flow rate control valve into an opened state from the state where the synthetic flow path is depressurized inside, and calibrate the second flow rate sensor on a basis of the volume of the synthetic flow path, a detected value of the second flow rate sensor, and the detected values of the pressure sensor.

\* \* \* \* \*